(12) United States Patent
Kim

(10) Patent No.: US 9,478,299 B2
(45) Date of Patent: Oct. 25, 2016

(54) MEMORY DEVICE AND READ METHOD OF MEMORY DEVICE

(71) Applicant: SAMSUNG ELECTRONICS CO., LTD., Suwon-Si, Gyeonggi-Do (KR)

(72) Inventor: Kyung-Ryun Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/629,616

(22) Filed: Feb. 24, 2015

(65) Prior Publication Data

US 2016/0035429 A1 Feb. 4, 2016

(30) Foreign Application Priority Data

Jul. 29, 2014 (KR) ........................ 10-2014-0096217

(51) Int. Cl.
| | |
|---|---|
| G11C 16/26 | (2006.01) |
| G11C 16/14 | (2006.01) |
| G11C 8/08 | (2006.01) |
| G11C 8/14 | (2006.01) |
| G11C 16/04 | (2006.01) |
| G11C 16/08 | (2006.01) |

(52) U.S. Cl.
CPC ................ G11C 16/26 (2013.01); G11C 8/08 (2013.01); G11C 8/14 (2013.01); G11C 16/0483 (2013.01); G11C 16/08 (2013.01)

(58) Field of Classification Search
CPC .... G11C 16/26; G11C 16/14; G11C 16/0483
See application file for complete search history.

(56) References Cited

U.S. PATENT DOCUMENTS

| | | | |
|---|---|---|---|
| 7,259,987 B2 | 8/2007 | Chen et al. | |
| 7,423,908 B2 | 9/2008 | Kim et al. | |
| 7,440,331 B2 | 10/2008 | Hemink | |
| 7,606,079 B2 | 10/2009 | Sekar et al. | |
| 7,916,533 B2 | 3/2011 | Dong et al. | |
| 8,018,777 B2 | 9/2011 | Kang | |
| 8,139,417 B2 | 3/2012 | Kim et al. | |
| 8,238,161 B2 | 8/2012 | Park et al. | |
| 8,427,876 B2 | 4/2013 | Takekida | |
| 8,599,619 B2 | 12/2013 | Fukuda | |
| 2012/0170365 A1* | 7/2012 | Kang | G11C 16/0483 365/185.03 |
| 2016/0019971 A1* | 1/2016 | Horii | G11C 16/0483 365/185.17 |

FOREIGN PATENT DOCUMENTS

KR 1012132 B 1/2011

* cited by examiner

*Primary Examiner* — Huan Hoang
*Assistant Examiner* — Tri Hoang
(74) *Attorney, Agent, or Firm* — Volentine & Whitt, PLLC

(57) ABSTRACT

In a method of reading a memory device, difference information is generated based on a distance difference between a position of a read word-line and a position of a boundary word-line. The read word-line corresponds to a read address. The boundary word-line corresponds to a last programmed word-line in a memory block included in a memory cell array. A read word-line voltage and an adjacent word-line voltage are determined based on the difference information. The read word-line voltage is applied to the read word-line. The adjacent word-line voltage is applied to an adjacent word-line that is adjacent to the read word-line. A read data corresponding to the read address is outputted based on the read word-line voltage and the adjacent word-line voltage. The read method of the memory device according to example embodiments may be capable of increasing the performance by controlling the voltages applied to the adjacent word-line and the read word-line according to the difference information determined based on the read word-line and the boundary word-line.

18 Claims, 24 Drawing Sheets

MEMORY DEVICE AND READ METHOD OF MEMORY DEVICE

CROSS-REFERENCE TO RELATED APPLICATION

This application claims priority under 35 USC §119 to Korean Patent Applications No. 10-2014-0096217, filed on Jul. 29, 2014 in the Korean Intellectual Property Office (KIPO), the contents of which are herein incorporated by reference in their entirety.

BACKGROUND

1. Technical Field

Example embodiments relate generally to a memory device and more particularly to a memory device and a method of reading the memory device.

2. Description of the Related Art

A semiconductor memory device may be classified into two types (i.e., a volatile memory device and a non-volatile memory device) according to whether data can be preserved in a power-off state.

Recently, as electronic devices need to consume less power and to be manufactured in a smaller size, a NAND flash memory device is widely being used as a non-volatile memory device. The NAND flash memory device may have a small size (i.e., a high degree of integration) by using multi-level cells that store data of multiple bits, respectively. Also, various research is in progress to improve reliability of a read operation of the memory device.

SUMMARY

Some example embodiments provide a method of reading a memory device capable of increasing reliability by decreasing a voltage applied to an adjacent word-line that is adjacent to a read word-line according to difference information determined based on the read word-line and a boundary word-line.

Some example embodiments provide a memory device capable of increasing reliability by decreasing a voltage applied to an adjacent word-line that is adjacent to a read word-line according to difference information determined based on the read word-line and a boundary word-line.

Some example embodiments provide a method of reading a memory device capable of decreasing error rate by controlling a voltage applied to a read word-line according to difference information determined based on the read word-line and a boundary word-line.

In a method of reading a memory device, difference information is generated based on a distance difference between a position of a read word-line and a position of a boundary word-line. The read word-line corresponds to a read address. The boundary word-line corresponds to a last programmed word-line in a memory block included in a memory cell array. A read word-line voltage and an adjacent word-line voltage are determined based on the difference information. The read word-line voltage is applied to the read word-line. The adjacent word-line voltage is applied to an adjacent word-line that is adjacent to the read word-line. Read data corresponding to the read address is output based on the read word-line voltage and the adjacent word-line voltage.

The memory block may include a program region and an erase region. The program region may correspond to word-line numbers that are equal to or less than a word-line number of the boundary word-line. The erase region may correspond to word-line numbers that are greater than the word-line number of the boundary word-line. When the adjacent word-line is included in the program region, the adjacent word-line voltage is a first voltage. In case the adjacent word-line is included in the erase region, the adjacent word-line voltage is a second voltage that is lower than the first voltage.

When the difference information is greater than one, the adjacent word-line voltage may be the second voltage. The difference information may be a difference value between a word-line number of the read word-line and the word-line number of the boundary word-line.

A word-line number of the adjacent word-line may be greater than the word-line number of the read word-line by one.

The adjacent word-line voltage may be greater than a voltage that is applied to an upper word-line. A word-line number of the upper word-line may be greater than the word-line number of the adjacent word-line.

The adjacent word-line voltage may be equal to a voltage that is applied to an upper word-line. A word-line number of the upper word-line may be greater than the word-line number of the adjacent word-line.

A word-line number of the adjacent word-line may be less than the word-line number of the read word-line by one.

The adjacent word-line voltage may be greater than a voltage that is applied to a lower word-line. A word-line number of the lower word-line may be less than the word-line number of the adjacent word-line and greater than the word-line number of the boundary word-line.

The adjacent word-line voltage may be equal to a voltage that is applied to a lower word-line. A word-line number of the lower word-line may be less than the word-line number of the adjacent word-line and greater than the word-line number of the boundary word-line.

When the difference information is equal to one, a word-line number of the adjacent word-line may be greater than a word-line number of the read word-line by one. The difference information may be a difference value between the word-line number of the read word-line and the word-line number of the boundary word-line.

The adjacent word-line voltage may be the second voltage.

When the read word-line is included in the program region, the read word-line voltage may be a third voltage. When the difference information is zero, the read word-line voltage may be a fourth voltage that is less than the third voltage.

A word-line number of the adjacent word-line may be greater than a word-line number of the read word-line by one. The adjacent word-line voltage may be the second voltage.

According to example embodiments, a memory device includes a memory cell array, a voltage generator and a control circuit. The memory cell array includes memory cells that are in a cross region of word-lines and bit-lines. The voltage generator generates a read word-line voltage and an adjacent word-line voltage. The read word-line voltage is applied to a read word-line corresponding to a read address. The adjacent word-line voltage is applied to an adjacent word-line that is adjacent to the read word-line. The control circuit controls the voltage generator to generate the read word-line voltage and the adjacent word-line voltage based on difference information that is generated based on a distance difference between a position of a read word-line and a position of a boundary word-line. The read word-line corresponds to a read address. The boundary word-line corresponds to a last programmed word-line in a memory block included in a memory cell array.

The read word-line may be included in a program region where data is programmed. The difference information may be a difference value between a word-line number of the boundary word-line and a word-line number of the read word-line.

The read word-line voltage may be determined based on a word-line number of the boundary word-line.

A read method of a memory device according to example embodiments may be capable of increasing performance by controlling voltages applied to an adjacent word-line and a read word-line according to difference information determined based on the read word-line and a boundary word-line.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
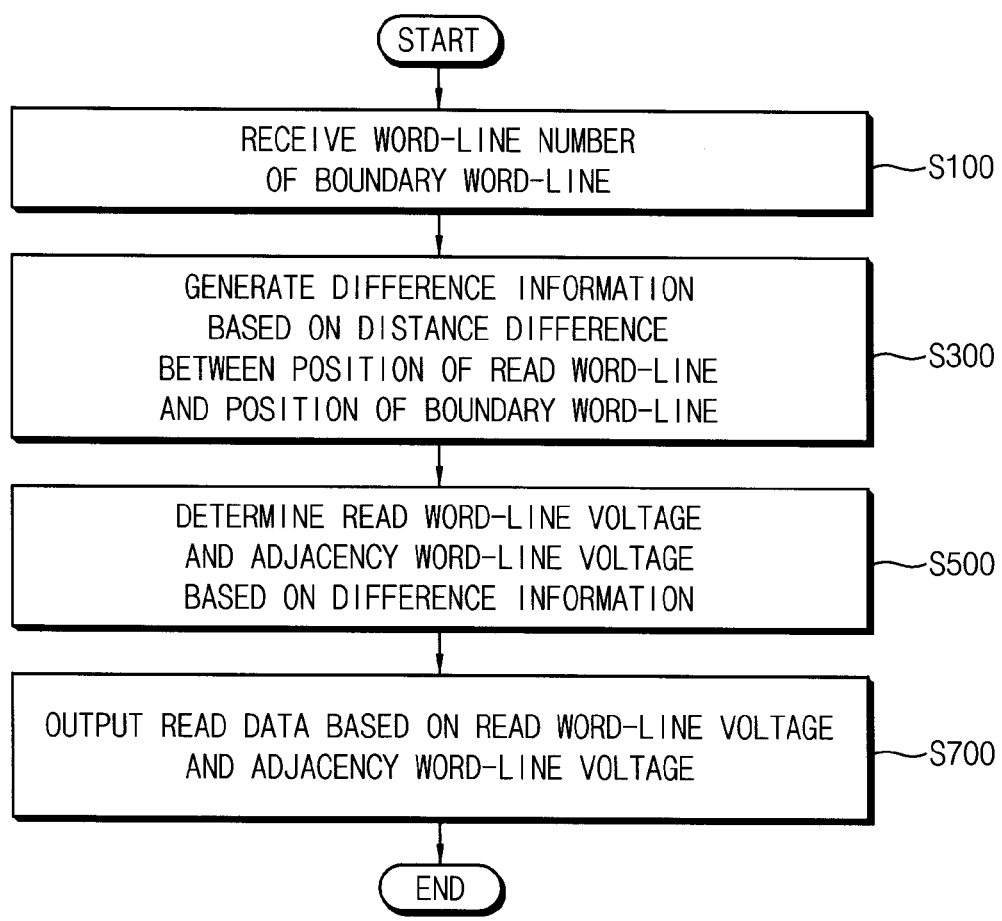
FIG. 1 is a flow chart illustrating a read method of a memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
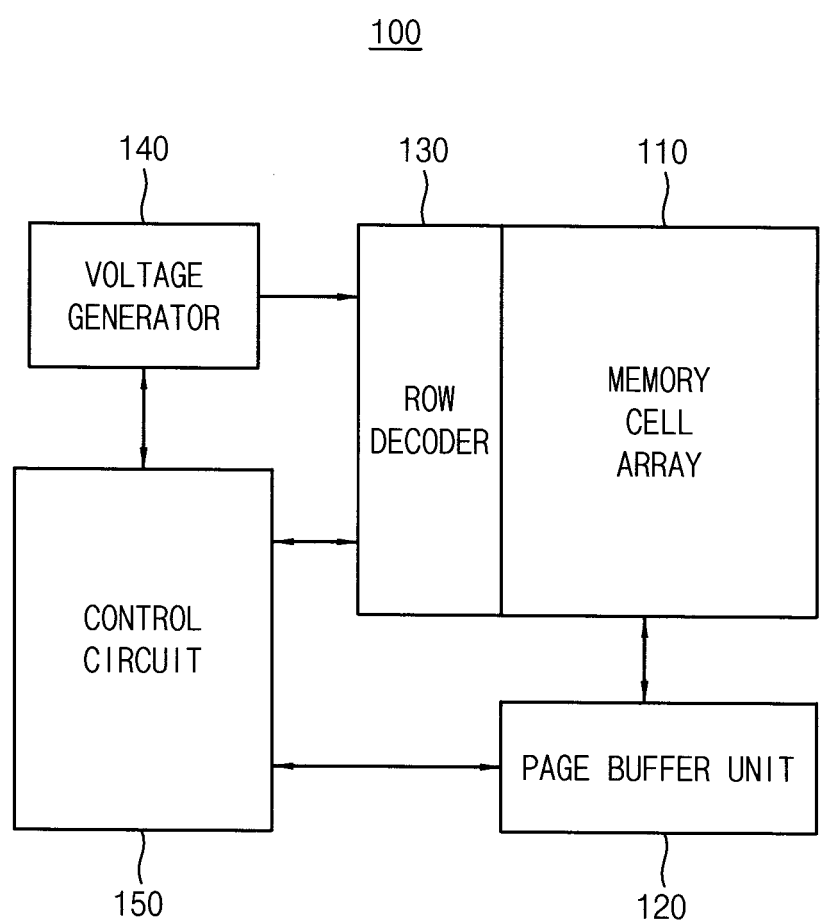
FIG. 2 is a block diagram illustrating a memory device performing a read method according to example embodiments.
Figure 3:
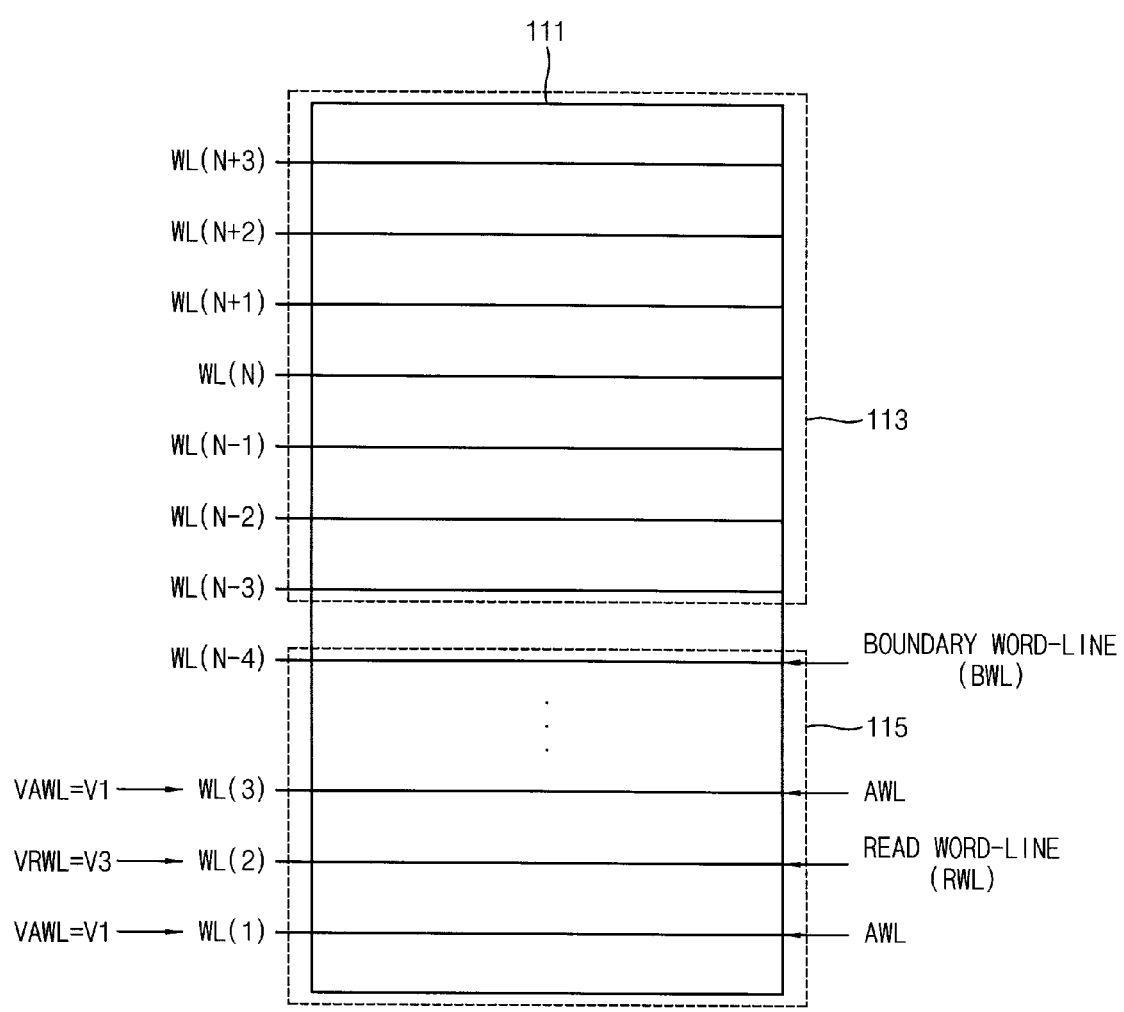
FIG. 3 is a diagram illustrating an example of a memory block included in the memory device of FIG. 2.

FIG. 1 is a flow chart illustrating a method of reading a memory device according to example embodiments, FIG. 2 is a block diagram illustrating a memory device performing a read method according to example embodiments and FIG. 3 is a diagram illustrating an example of a memory block included in the memory device of FIG. 2.

Referring to FIGS. 1 to 3, in a read method of a memory device 100, the memory device 100 may receive a word-line number of a boundary word-line BWL corresponding to a last programmed word-line in a memory block 111 included in a memory cell array 110 (S100). For example, the word-line number of the boundary word-line BWL may be provided from a memory controller. Difference information DI is generated based on a distance difference between a position of a read word-line RWL and a position of a boundary word-line BWL (S300). The read word-line RWL may correspond to a read address. The boundary word-line BWL may correspond to a last programmed word-line in a memory block 111 included in a memory cell array 110. For example, a distance difference between a position of a read word-line RWL and a position of a boundary word-line BWL may be a difference value between a word-line number of the read word-line RWL and a word-line number of the boundary word-line BWL. The distance difference may be a physical distance or a logical distance determined by the word-line number.

For example, the word-line number of the boundary word-line BWL corresponding to the last programmed word-line in a memory block 111 may be N–4. When the word-line number of the boundary word-line BWL is N–4 and the word-line number of the read word-line RWL is N+1, the difference information DI corresponding to difference value between the word-line number of the read word-line RWL and the word-line number of the boundary word-line BWL may be 5. Also, when the word-line number of the boundary word-line BWL is N–4 and the word-line number of the read word-line RWL is N–3, the difference information DI corresponding to difference value between the word-line number of the read word-line RWL and the word-line number of the boundary word-line BWL may be 1. Also, when the word-line number of the boundary word-line BWL is N–4 and the word-line number of the read word-line RWL is N–4, the difference information DI corresponding to difference value between the word-line number of the read word-line RWL and the word-line number of the boundary word-line BWL may be 0. The memory block 111 may include a program region 115 and an erase region 113. The program region 115 may correspond to word-line numbers that are equal to or less than a word-line number of the boundary word-line BWL. For example, the word-line number of the boundary word-line BWL may be N–4. A region corresponding to word-line numbers that are equal to or less than N–4 may be included in the program region 115.

The erase region 113 may correspond to word-line numbers that are greater than the word-line number of the boundary word-line BWL. For example, the word-line number of the boundary word-line BWL may be N–4. A region corresponding to word-line numbers that are greater than N–4 may be included in the erase region 113.

When the adjacent word-line AWL is included in the program region 115, the adjacent word-line voltage VAWL may be a first voltage V1. For example, the word-line number of the boundary word-line BWL may be N–4. When the word-line number of the read word-line RWL is 2, the word-line number of the adjacent word-line AWL may be 1 and 3. The word-lines corresponding to the word-line number of the adjacent word-line AWL may be included in the program region 115. In this case, the adjacent word-line voltage VAWL applied to the adjacent word-line AWL may be the first voltage V1.

When the adjacent word-line AWL is included in the erase region 113, the adjacent word-line voltage VAWL may be a second voltage V2 that is lower than the first voltage V1. For example, the word-line number of the boundary word-line BWL may be N–4. When the word-line number of the read word-line RWL is N, the word-line number of the adjacent word-line AWL may be N+1 and N–1. The word-lines corresponding to the word-line number of the adjacent word-line AWL may be included in the erase region 113. In this case, the adjacent word-line voltage VAWL applied to the adjacent word-line AWL may be the second voltage V2. The second voltage V2 may be lower than the first voltage V1.

A read word-line voltage VRWL and an adjacent word-line voltage VAWL are determined based on the difference information DI (S500). The read word-line voltage VRWL is applied to the read word-line RWL. The adjacent word-line voltage VAWL is applied to an adjacent word-line AWL that is adjacent to the read word-line RWL. For example, when the difference information DI is greater than one, the word-line number of the adjacent word-line AWL may be greater than the word-line number of the read word-line RWL. Also, the word-line number of the adjacent word-line AWL may be less than the word-line number of the read word-line RWL. In this case, the adjacent word-line voltage VAWL applied to the adjacent word-line AWL may be the second voltage V2. For example, when the difference information DI is equal to one, the word-line number of the adjacent word-line AWL may be greater than the word-line number of the read word-line RWL. In this case, the adjacent word-line voltage VAWL applied to the adjacent word-line AWL may be the second voltage V2.

A read data corresponding to the read address is outputted based on the read word-line voltage VRWL and the adjacent word-line voltage VAWL (S700).

A memory device 100 according to example embodiments may provide the read word-line voltage VRWL to the read word-line RWL and the adjacent word-line voltage VAWL to the adjacent word-line AWL based on the difference information DI.

The read method of the memory device 100 according to example embodiments may be capable of increasing the reliability by decreasing the voltages applied to the adjacent word-line AWL and the read word-line RWL according to the difference information DI determined based on the read word-line RWL and the boundary word-line BWL.

Referring to FIG. 2, a memory device 100 may be a flash memory device. The memory device 100 comprises a memory cell array 110, a page buffer unit 120, a row decoder 130, a voltage generator 140, and a control circuit 150. Memory cell array 110 comprises multiple memory cells connected to multiple word lines and multiple bit lines, respectively. The memory cells may be NAND or NOR flash memory cells and may be arranged in a two or three dimensional array structure. In some embodiments, the memory cells may be single level cells (SLCs) or multi-level cells (MLCs). In embodiments including MLCs, a program scheme in a write mode may be, for instance, a shadow program scheme, a reprogrammable scheme, or an on-chip buffered program scheme.

Page buffer unit 120 is connected to the bit lines and stores write data programmed in memory cell array 110 or read data sensed from memory cell array 110. In other words, page buffer unit 120 may be operated as a write driver or a sensing amplifier according to an operation mode of flash memory device 100. For example, page buffer unit 120 may be operated as the write driver in the write mode and as the sensing amplifier in the read mode.

Row decoder 130 is connected to the word lines and selects at least one of the word lines in response to a row address. Voltage generator 140 generates word line voltages such as a program voltage, a pass voltage, a verification voltage, an erase voltage and a read voltage according to a control of control circuit 150. Control circuit 150 controls page buffer unit 120, row decoder 130 and voltage generator 140 to perform program, erase, and read operations on memory cell array 110.

The control circuit 150 may control operations of the memory device 100. In read operation, the control circuit 150 may control the voltage generator 140 to generate the read voltages. Also, the control circuit 150 may control the row decoder so that the read voltages corresponding to the non-selection word-lines are applied based on the position of the selection word-line.

The memory device 100 according to example embodiments includes a memory cell array 110, a voltage generator 140 and a control circuit 150. The memory cell array 110 may include memory cells that are in a cross region of word-lines and bit-lines. The voltage generator 140 may generate a read word-line voltage VRWL and an adjacent word-line voltage VAWL. The read word-line voltage VRWL may be applied to a read word-line RWL corresponding to a read address. The adjacent word-line voltage VAWL may be applied to an adjacent word-line AWL that is adjacent to the read word-line RWL. The control circuit 150 may control the voltage generator 140 to generate the read word-line RWL voltage VRWL and the adjacent word-line voltage VAWL based on difference information DI that is generated based on a distance difference between a position of a read word-line RWL and a position of a boundary word-line BWL. The read word-line RWL may correspond to a read address. The boundary word-line BWL may correspond to a last programmed word-line in a memory block 111 included in a memory cell array 110. For example, the difference information DI may be the difference value between the word-line number of the read word-line RWL and the word-line number of the boundary word-line BWL.

The difference information DI may be generated based on the distance difference between a position of a read word-line RWL and a position of a boundary word-line BWL. The read word-line RWL may correspond to a read address. The boundary word-line BWL may correspond to a last programmed word-line in a memory block 111 included in a memory cell array 110. For example, a distance difference between the position of the read word-line RWL and the position of the boundary word-line BWL may be the difference value between the word-line number of the read word-line RWL and the word-line number of the boundary word-line BWL. The distance difference may be the physical distance or the logical distance determined by the word-line number. The memory device 100 according to example embodiments may provide the read word-line voltage VRWL to the read word-line RWL and the adjacent word-line voltage VAWL to the adjacent word-line AWL based on the difference information DI.

In an example embodiment, the read word-line RWL may be included in a program region 115 where data is programmed. The difference information DI may be a difference value between a word-line number of the boundary word-line BWL and a word-line number of the read word-line RWL. In an example embodiment, the read word-line voltage VRWL may be determined based on a word-line number of the boundary word-line BWL.

Figure 4:
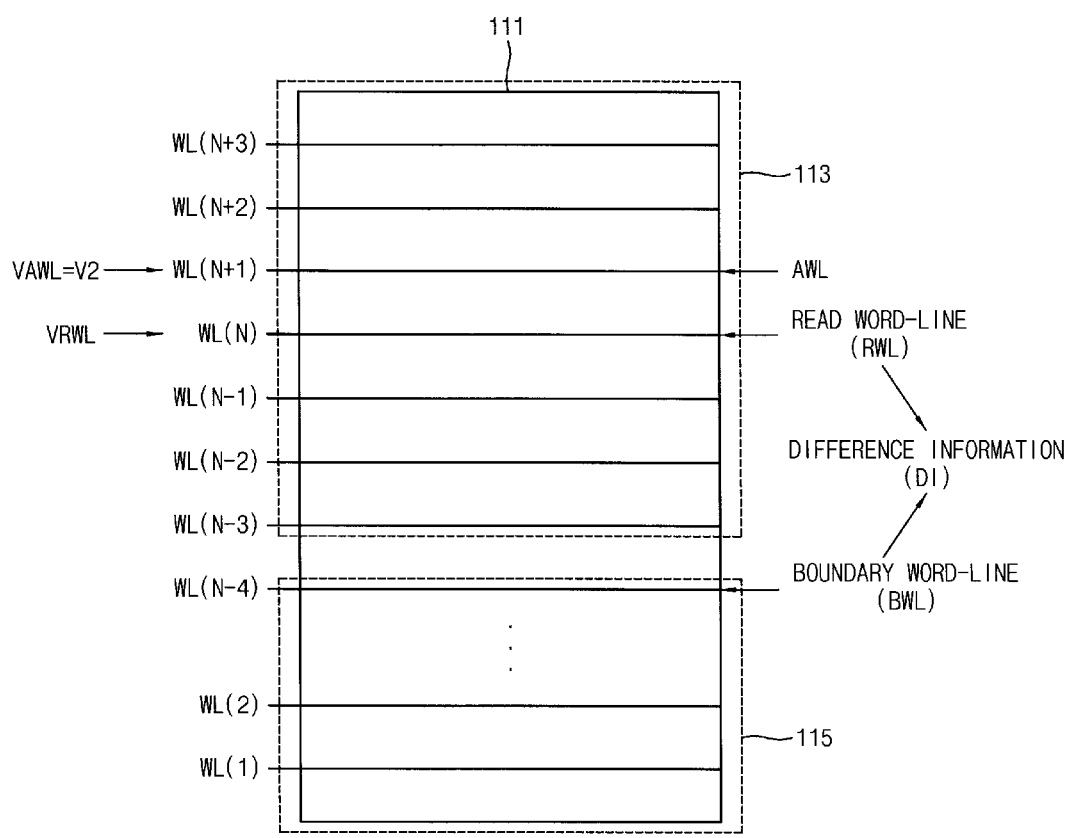
FIGS. 4 and 5 are diagrams for describing an example of the read method of the memory device of FIG. 1 in case difference information is greater than one.
Figure 5:
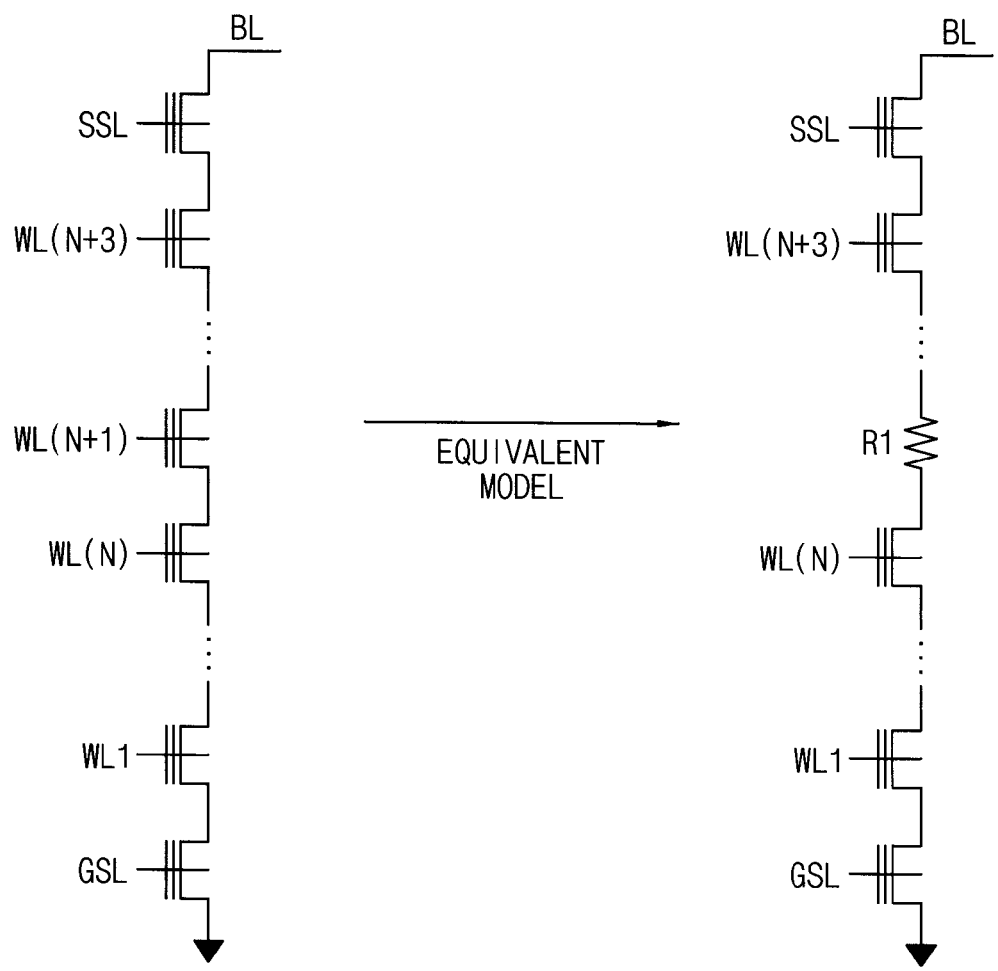

FIGS. 4 and 5 are diagrams for describing an example of the read method of the memory device of FIG. 1 when the difference information is greater than one. Referring to FIGS. 4 and 5, when the difference information DI is greater than one, the word-line number of the read word-line RWL may be greater than the word-line number of the boundary word-line BWL. For example, the word-line number of the boundary word-line BWL may be N–4 and the word-line number of the read word-line RWL may be N, the difference information DI corresponding to difference value between the word-line number of the read word-line RWL and the word-line number of the boundary word-line BWL may be 4.

When the difference information DI is greater than one, the read word-line RWL and the adjacent word-line AWL that is adjacent to the read word-line RWL may be included in the erase region 113. For example, the word-line number of the read word-line RWL may be N and the word-line number of the adjacent word-line AWL that is adjacent to the read word-line RWL may be N+1. An equivalent resistor of the memory cell corresponding to the adjacent word-line AWL may be R1. The state of the memory cell corresponding to the adjacent word-line AWL may be an erase state. When the state of the memory cell corresponding to the adjacent word-line AWL is the erase state, a value of the equivalent resistor may be low. Therefore when the adjacent word-line AWL is included in the erase region 113, the voltage applied to the adjacent word-line AWL may be the second voltage V2 that is lower than the first voltage V1. When the voltage applied to the adjacent word-line AWL is the second voltage V2 that is lower than the first voltage V1, an error rate may be decreased in the read operation.

In an example embodiment, when the difference information DI is greater than one, the adjacent word-line voltage VAWL may be the second voltage V2. The difference information DI may be a difference value between a word-line number of the read word-line RWL and the word-line number of the boundary word-line BWL. For example, the word-line number of the read word-line RWL may be N and the word-line number of the adjacent word-line AWL that is adjacent to the read word-line RWL may be N+1. In this case, the adjacent word-line AWL may be included in the erase region 113 and the adjacent word-line voltage VAWL applied to the adjacent word-line AWL may be the second voltage V2.

In an example embodiment, the word-line number of the adjacent word-line AWL may be greater than the word-line number of the read word-line RWL by one. For example, when the word-line number of the read word-line RWL is N and the word-line number of the adjacent word-line AWL that is adjacent to the read word-line RWL is N+1, the word-line number of the adjacent word-line AWL may be greater than the word-line number of the read word-line RWL by one.

In an example embodiment, the word-line number of the adjacent word-line AWL may be greater than the word-line number of the read word-line RWL by one or two. For example, when the word-line number of the read word-line RWL is N and the word-line number of the adjacent word-line AWL that is adjacent to the read word-line RWL is N+1 and N+2, the word-line number of the adjacent word-line AWL may be greater than the word-line number of the read word-line RWL by one or two.

The difference information DI may be generated based on the distance difference between a position of a read word-line RWL and a position of a boundary word-line BWL. The read word-line RWL may correspond to a read address. The boundary word-line BWL may correspond to a last programmed word-line in a memory block 111 included in a memory cell array 110. For example, a distance difference between the position of the read word-line RWL and the position of the boundary word-line BWL may be the difference value between the word-line number of the read word-line RWL and the word-line number of the boundary word-line BWL. The distance difference may be the physical distance or the logical distance determined by the word-line number. The memory device 100 according to example embodiments may provide the read word-line voltage VRWL to the read word-line RWL and the adjacent word-line voltage VAWL to the adjacent word-line AWL based on the difference information DI.

The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

Figure 6:
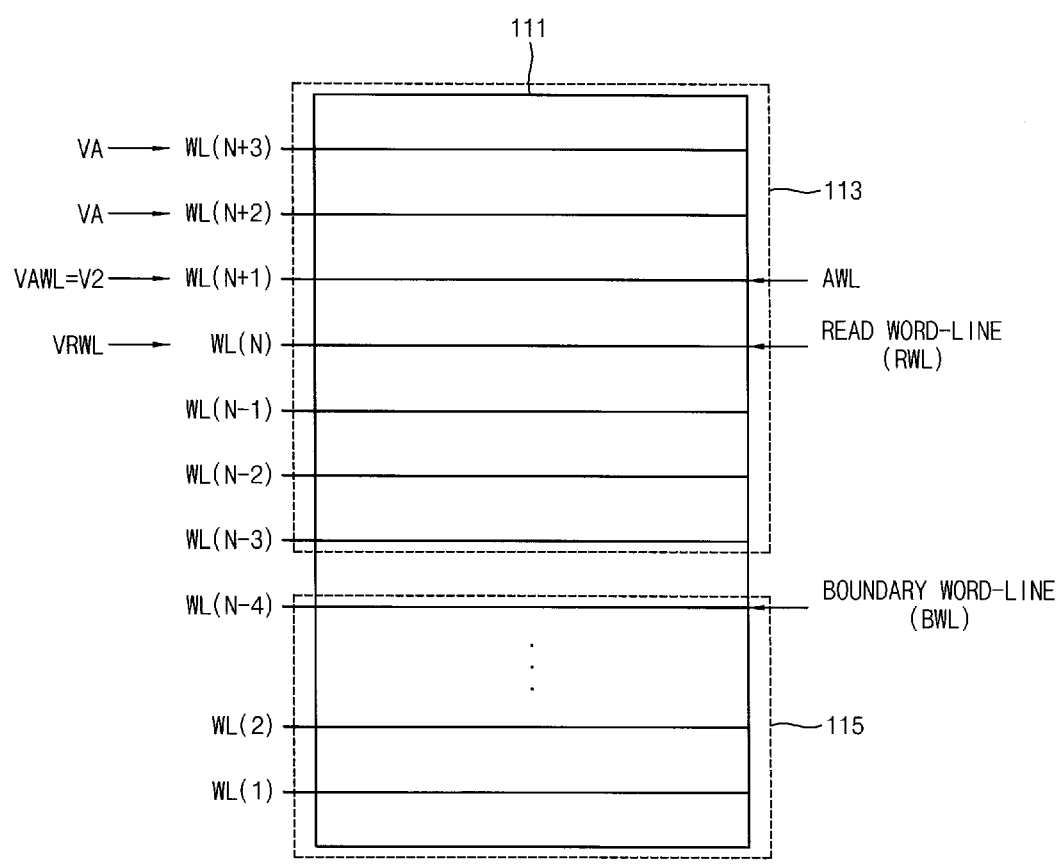
FIGS. 6 and 7 are diagrams illustrating an example of a memory block included in the memory device of FIG. 2 in case difference information is greater than one.
Figure 7:
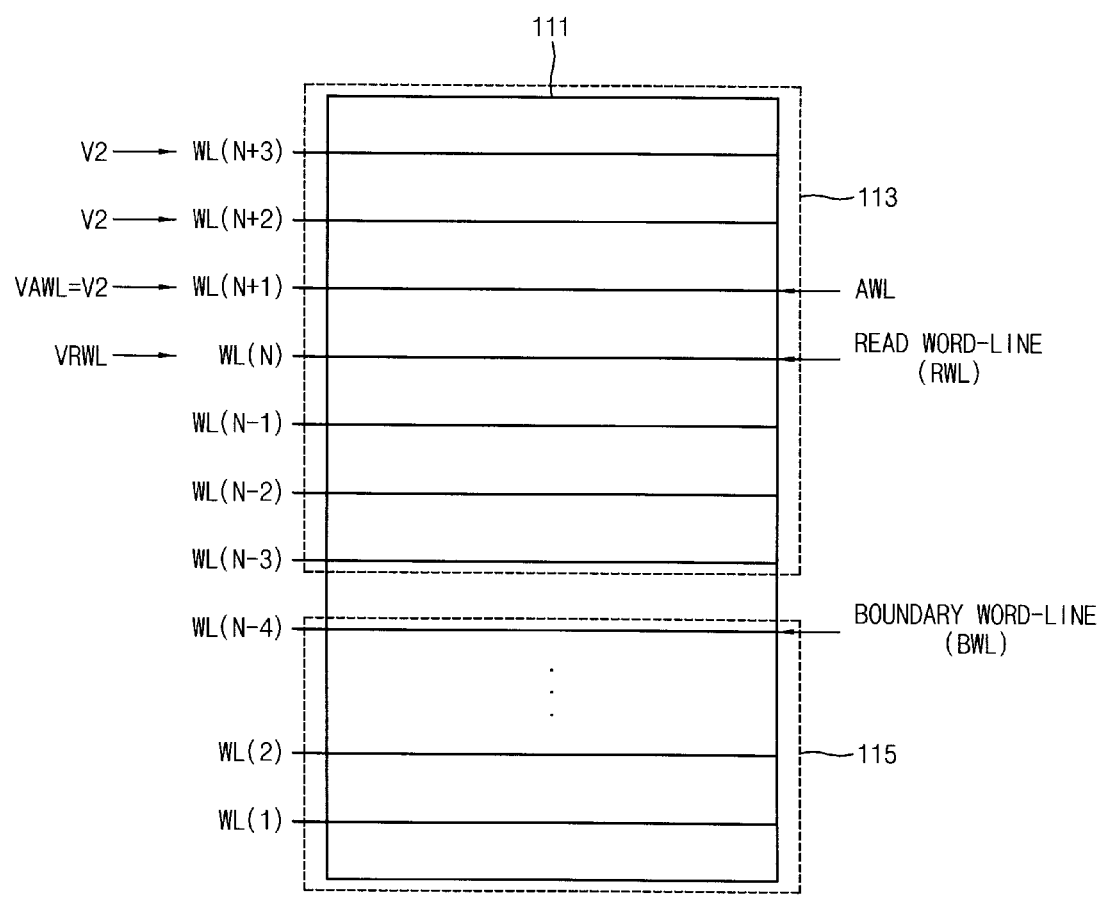

FIGS. 6 and 7 are diagrams illustrating an example of a memory block included in the memory device of FIG. 2 when difference information is greater than one. Referring to FIGS. 6 and 7, the memory block 111 may include a program region 115 and an erase region 113. The program region 115 may correspond to word-line numbers that are equal to or less than a word-line number of the boundary word-line BWL. For example, the word-line number of the boundary word-line BWL may be N−4. A region corresponding to word-line numbers that are equal to or less than N−4 may be included in the program region 115. The erase region 113 may correspond to word-line numbers that are greater than the word-line number of the boundary word-line BWL. For example, the word-line number of the boundary word-line BWL may be N−4. A region corresponding to word-line numbers that are greater than N−4 may be included in the erase region 113.

For example, the word-line number of the read word-line RWL may be N and the word-line number of the adjacent word-line AWL may be N+1. In this case, the word-lines corresponding to the word-line number of the adjacent word-line AWL may be included in the erase region 113 and the adjacent word-line voltage VAWL applied to the adjacent word-line AWL may be the second voltage V2. The second voltage V2 may be lower than the first voltage V1.

In an example embodiment, the adjacent word-line voltage VAWL may be greater than a voltage that is applied to an upper word-line. A word-line number of the upper word-line may be greater than the word-line number of the adjacent word-line AWL. For example, when the word-line number of the read word-line RWL is N, the word-line number of the adjacent word-line AWL is N+1, the word-line number of the upper word-line may be N+2, N+3. A region corresponding to the word-line number of the upper word-line may be included in the erase region 113. The adjacent word-line voltage VAWL applied to the adjacent word-line AWL may be the second voltage V2. When the adjacent word-line voltage VAWL applied to the adjacent word-line AWL is the second voltage V2, an upper word-line voltage VA applied to the upper word-line may be a voltage lower than the second voltage V2.

In an example embodiment, the adjacent word-line voltage VAWL may be equal to a voltage that is applied to an upper word-line. A word-line number of the upper word-line may be greater than the word-line number of the adjacent word-line AWL. For example, when the word-line number of the read word-line RWL is N, the word-line number of the adjacent word-line AWL is N+1, the word-line number of the upper word-line may be N+2, N+3. The region corresponding to the word-line number of the upper word-line may be included in the erase region 113. The adjacent word-line voltage VAWL applied to the adjacent word-line AWL may be the second voltage V2. When the adjacent word-line voltage VAWL applied to the adjacent word-line AWL is the second voltage V2, the upper word-line voltage VA applied to the upper word-line may be equal to the second voltage V2.

In an example embodiment, the upper word-line may be included in the erase region 113 where data is not programmed.

Figure 8:
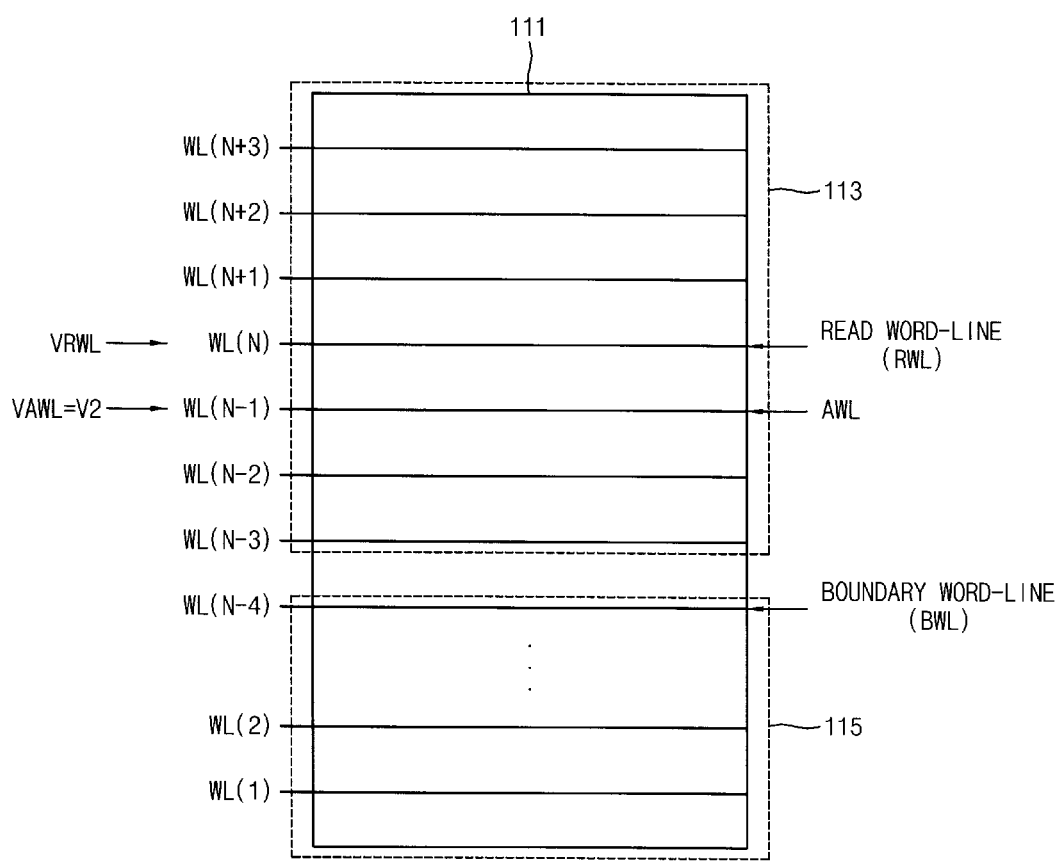
FIGS. 8 and 9 are diagrams for describing another example of the read method of the memory device of FIG. 1 in case difference information is greater than one.
Figure 9:
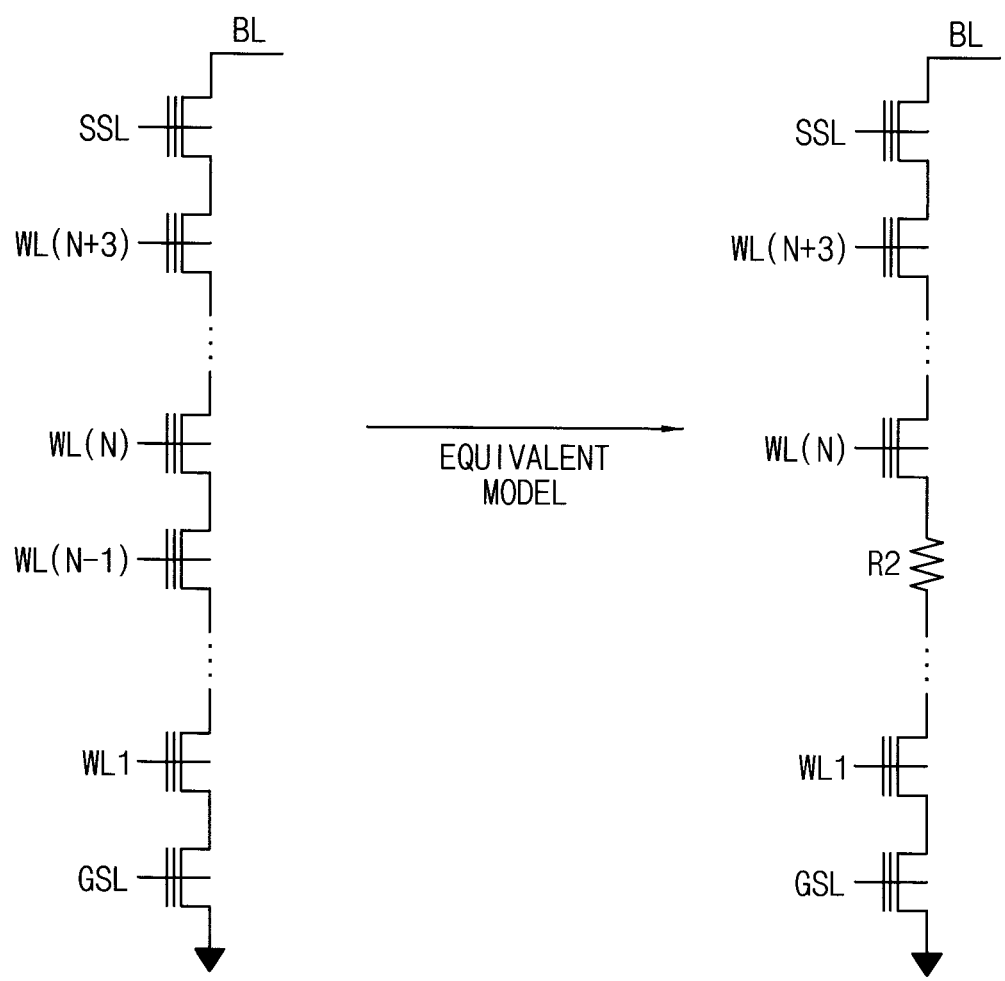

FIGS. 8 and 9 are diagrams for describing another example of the read method of the memory device of FIG. 1 when the difference information is greater than one.

Referring to FIGS. 8 and 9, when the difference information DI is greater than one, the read word-line RWL and the adjacent word-line AWL that is adjacent to the read word-line RWL may be included in the erase region 113. For example, the word-line number of the read word-line RWL may be N and the word-line number of the adjacent word-line AWL that is adjacent to the read word-line RWL may be N−1. An equivalent resistor of the memory cell corresponding to the adjacent word-line AWL may be R2. The state of the memory cell corresponding to the adjacent word-line AWL may be an erase state. When the state of the memory cell corresponding to the adjacent word-line AWL is the erase state, the value of the equivalent resistor may be low. Therefore when the adjacent word-line AWL is included in the erase region 113, the voltage applied to the adjacent word-line AWL may be the second voltage V2 that is lower than the first voltage V1. When the voltage applied to the adjacent word-line AWL is the second voltage V2 that is lower than the first voltage V1, the error rate may be decreased in the read operation.

In an example embodiment, a word-line number of the adjacent word-line AWL may be less than the word-line number of the read word-line RWL by one. For example, when the word-line number of the read word-line RWL is N and the word-line number of the adjacent word-line AWL that is adjacent to the read word-line RWL is N−1, the word-line number of the adjacent word-line AWL may be less than the word-line number of the read word-line RWL by one.

In an example embodiment, the word-line number of the adjacent word-line AWL may be less than the word-line number of the read word-line RWL by one or two. For example, when the word-line number of the read word-line RWL is N and the word-line number of the adjacent word-line AWL that is adjacent to the read word-line RWL is N−1 and N−2, the word-line number of the adjacent word-line AWL may be less than the word-line number of the read word-line RWL by one or two.

A memory device 100 according to example embodiments may provide the read word-line voltage VRWL to the read word-line RWL and the adjacent word-line voltage VAWL to the adjacent word-line AWL based on the difference information DI.

Figure 10:
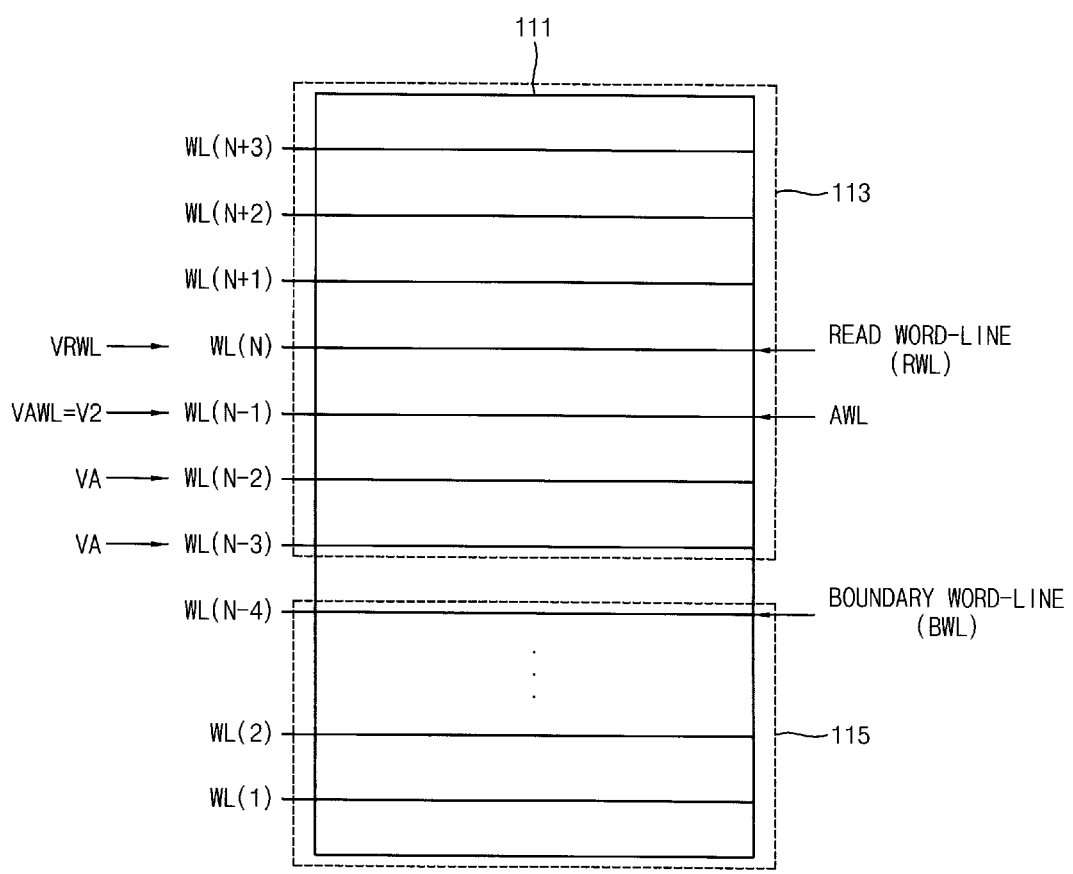
FIGS. 10 and 11 are diagrams illustrating another example of a memory block included in the memory device of FIG. 2 in case difference information is greater than one.
Figure 11:
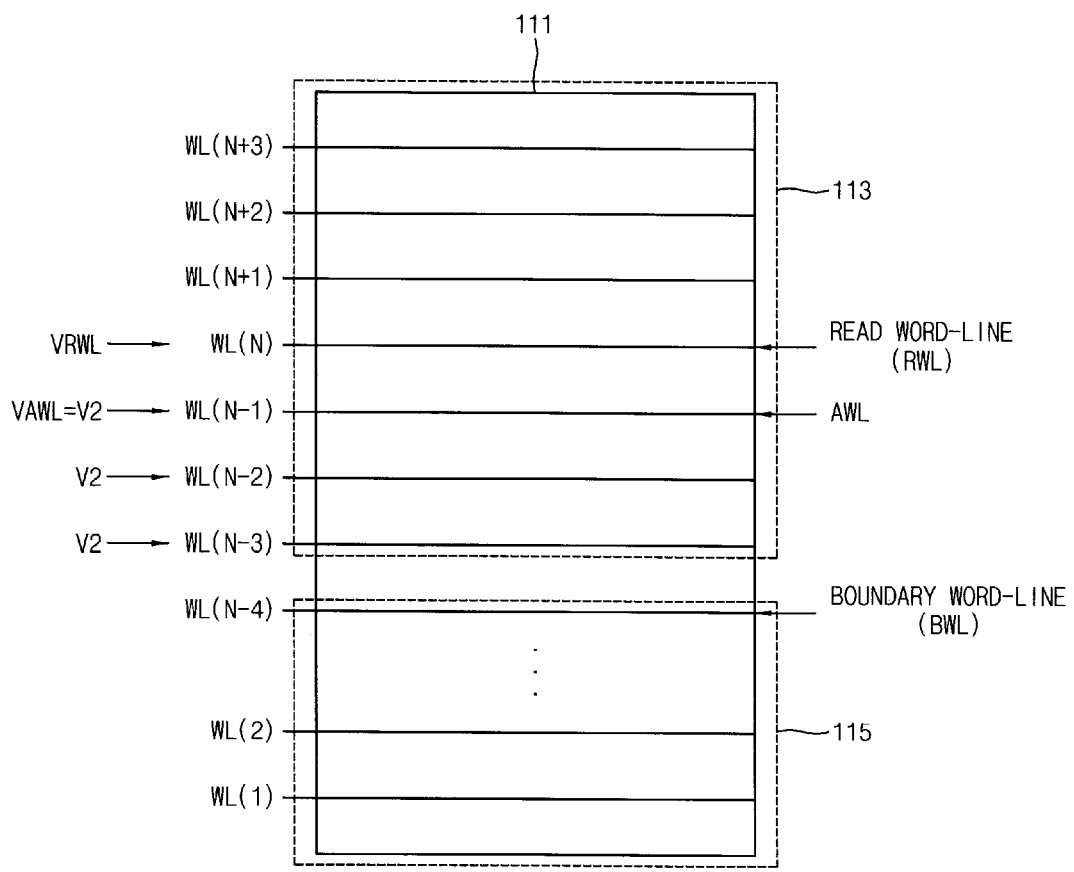

FIGS. 10 and 11 are diagrams illustrating another example of a memory block 111 included in the memory device of FIG. 2 in case difference information is greater than one.

Referring to FIGS. 10 and 11, the memory block 111 may include a program region 115 and an erase region 113. The program region 115 may correspond to word-line numbers that are equal to or less than a word-line number of the boundary word-line BWL. For example, the word-line number of the boundary word-line BWL may be N−4. A region corresponding to word-line numbers that are equal to or less than N−4 may be included in the program region 115. The erase region 113 may correspond to word-line numbers that are greater than the word-line number of the boundary word-line BWL. For example, the word-line number of the boundary word-line BWL may be N−4. A region corresponding to word-line numbers that are greater than N−4 may be included in the erase region 113.

For example, the word-line number of the read word-line RWL may be N and the word-line number of the adjacent word-line AWL may be N−1. In this case, the word-lines corresponding to the word-line number of the adjacent word-line AWL may be included in the erase region 113 and the adjacent word-line voltage VAWL applied to the adjacent word-line AWL may be the second voltage V2.

In an example embodiment, the adjacent word-line voltage VAWL may be greater than a voltage that is applied to a lower word-line. A word-line number of the lower word-line may be less than the word-line number of the adjacent word-line AWL and greater than the word-line number of the boundary word-line BWL. For example, when the word-line number of the read word-line RWL is N, the word-line number of the adjacent word-line AWL is N−1, the word-line number of the lower word-line may be N−2, N−3. A region corresponding to the word-line number of the lower word-line may be included in the erase region 113. The adjacent word-line voltage VAWL applied to the adjacent word-line AWL may be the second voltage V2. When the adjacent word-line voltage VAWL applied to the adjacent word-line AWL is the second voltage V2, a lower word-line voltage VA applied to the lower word-line may be a voltage lower than the second voltage V2.

In an example embodiment, the adjacent word-line voltage VAWL may be equal to a voltage that is applied to a lower word-line. A word-line number of the lower word-line may be less than the word-line number of the adjacent word-line AWL and greater than the word-line number of the boundary word-line BWL. For example, when the word-line number of the boundary word-line BWL is N−4, the word-line number of the read word-line RWL is N, the word-line number of the adjacent word-line AWL is N−1, the word-line number of the lower word-line may be N−2, N−3. The region corresponding to the word-line number of the lower word-line may be included in the erase region 113. The adjacent word-line voltage VAWL applied to the adjacent word-line AWL may be the second voltage V2. When the adjacent word-line voltage VAWL applied to the adjacent word-line AWL is the second voltage V2, the lower word-line voltage VA applied to the lower word-line may be equal to the second voltage V2.

In an example embodiment, the lower word-line may be included in the erase region 113 where data is not programmed.

The memory device 100 according to example embodiments may provide the read word-line voltage VRWL to the read word-line RWL and the adjacent word-line voltage VAWL to the adjacent word-line AWL based on the difference information DI. The distance difference may be the physical distance or the logical distance determined by the word-line number. The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

Figure 12:
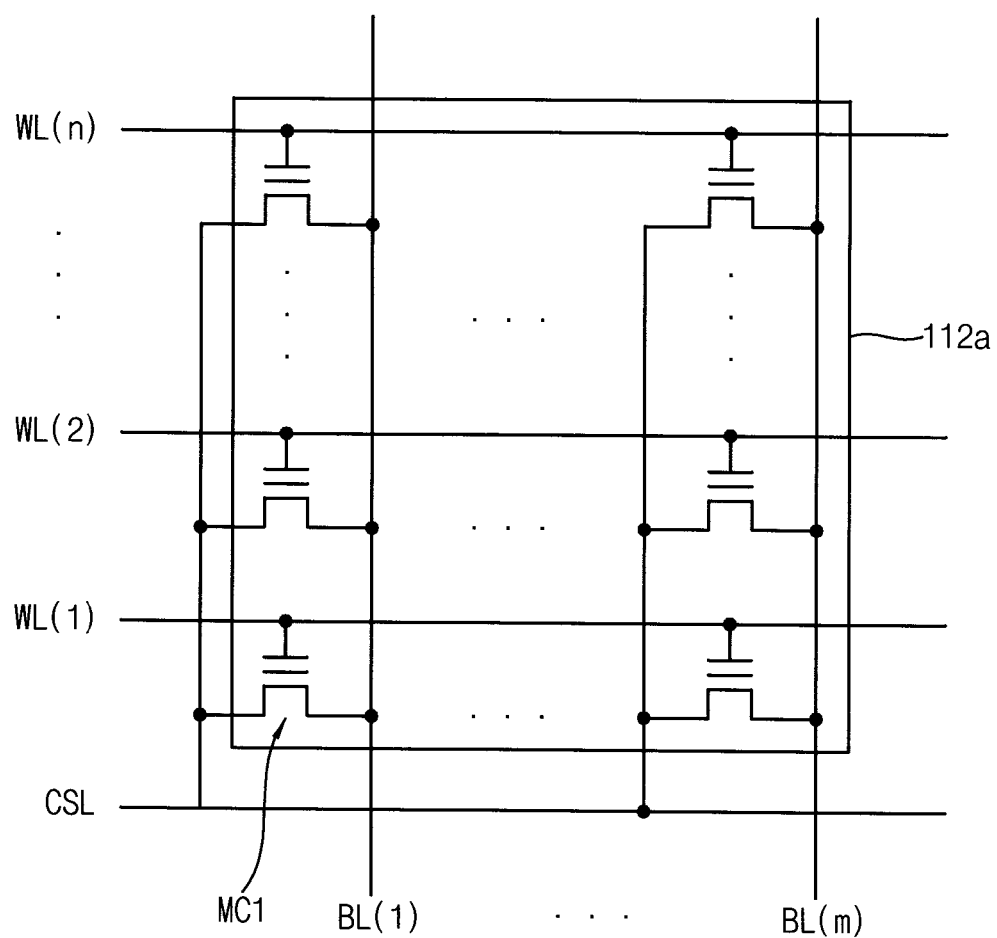
FIG. 12 is a diagram illustrating an example of a memory cell array included in the memory device of FIG. 2.
Figure 13:
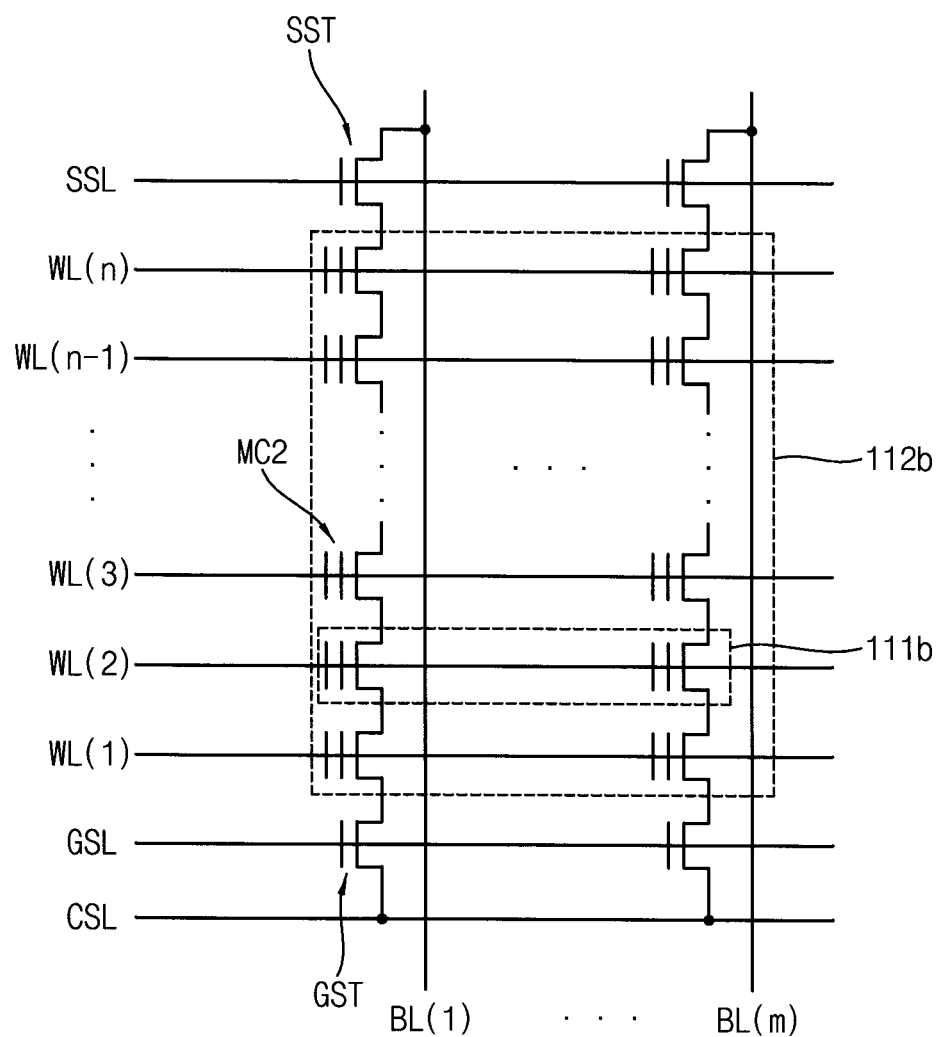
FIG. 13 is a diagram illustrating another example of a memory cell array included in the memory device of FIG. 2.
Figure 14:
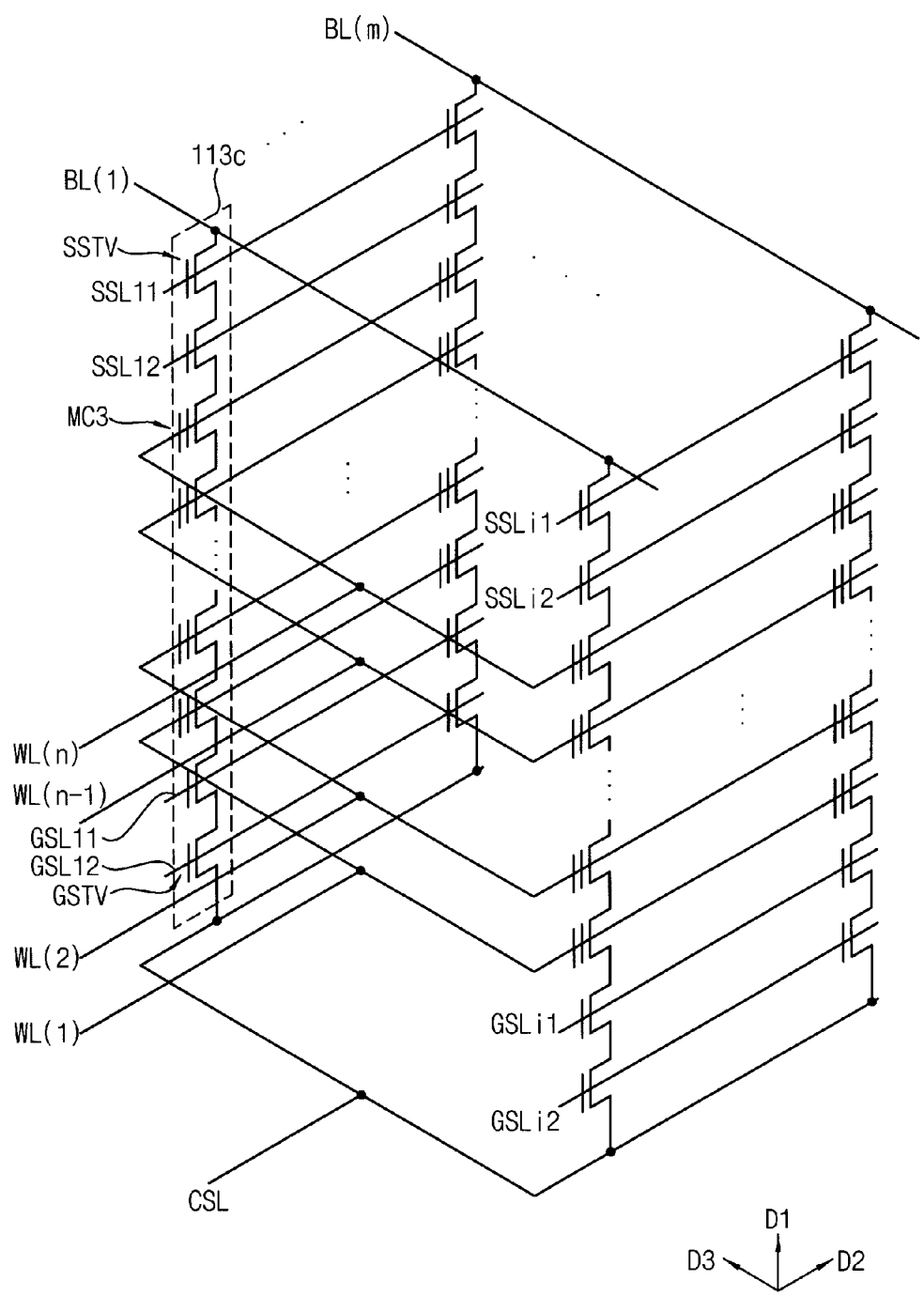
FIG. 14 is a diagram illustrating still another example of a memory cell array included in the memory device of FIG. 2.

FIG. 12 is a diagram illustrating an example of a memory cell array included in the memory device of FIG. 2, FIG. 13 is a diagram illustrating another example of a memory cell array included in the memory device of FIG. 2 and FIG. 14 is a diagram illustrating still another example of a memory cell array included in the memory device of FIG. 2.

Referring to FIG. 12, memory cell array 110a may include multiple memory cells MC1. Memory cells MC1 located in the same row may be disposed in parallel between one of bit lines BL(1), ..., BL(m) and a common source line CSL and may be connected in common to one of word lines WL(1), WL(2), ..., WL(n)). For example, memory cells located in the first row may be disposed in parallel between the first bit line WL(1) and common source line CSL. The gate electrodes of the memory cells disposed in the first row may be connected in common to first word line WL(1). Memory cells MC1 may be controlled according to a level of a voltage applied to word lines WL(1), ..., WL(n). The NOR flash memory device comprising memory cell array 110a may perform the write and read operations in units of byte or words and may perform the erase operation in units of block.

Referring to FIG. 13, memory cell array 110b comprises string selection transistors SST, ground selection transistors GST and memory cells MC2. String selection transistors SST are connected to bit lines BL(1), ..., BL(m), and ground selection transistors GST are connected to common source line CSL. Memory cells MC2 disposed in the same row are disposed in series between one of bit lines BL(1), ..., BL(m) and common source line CSL, and memory cells MCs disposed in the same column are connected in common to one of word lines WL(1), WL(2), WL(3), ..., WL(n−1), WL(n). That is memory cells MC2 are connected in series between string selection transistors SST and ground selection transistors GST, and the word lines of 16, 32, or 64 are disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), ..., WL(n).

The NAND flash memory device comprising memory cell array 110b performs write and read operations in units of page 111b, and it performs erase operations in units of block 112b. Meanwhile, according to some embodiments, each of the page buffers may be connected to even and odd bit lines one by one. In this case, the even bit lines form an even page, the odd bit lines form an odd page, and the even and odd pages may perform by turns and sequentially the write operation into memory cells MC2.

Referring to FIG. 14, memory cell array 110c comprises multiple strings 113c having a vertical structure. Strings 113c are formed in the second direction to form a string row. Multiple string rows are formed in the third row to form a string array. Each of strings 113c comprises ground selection transistors GSTV, memory cells MC3, and string selection transistors SSTV, which are disposed in series in the first direction between bit lines BL(1), . . . , BL(m) and common source line CSL.

Ground selection transistors GSTV are connected to ground selection lines GSL11, GSL12, . . . , GSLi1, GSLi2, respectively, and string selection transistors SSTV are connected to string selection lines SSL11, SSL12, . . . , SSLi1, SSLi2, respectively. Memory cells MC3 disposed the same layer are connected in common to one of word lines WL(1), WL(2), . . . , WL(n-1), WL(n). Ground selection lines GSL11, . . . , GSLi2 and string selection lines SSL11, . . . , SSLi2 extend in the second direction and are formed along the third direction. Word lines WL(1), . . . , WL(n) extend in the second direction and are formed along the first and third directions. Bit lines BL(1), . . . , BL(m) extend in the third direction and are formed along the second direction. Memory cells MC3 are controlled according to a level of a voltage applied to word lines WL(1), . . . , WL(n).

Because the vertical flash memory device comprising memory cell array 110c comprises NAND flash memory cells, like the NAND flash memory device, the vertical flash memory device performs the write and read operations in units of pages and the erase operation in units of block. In some embodiments, two string selection transistors in one string 113c are connected to one string selection line, and two ground selection transistors in one string are connected to one ground selection line. Further, according to some embodiments, one string comprises one string selection transistor and one ground selection transistor.

The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

In addition, in an embodiment of the present disclosure, a three dimensional (3D) memory array 110C is provided in the memory device 100. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 15:
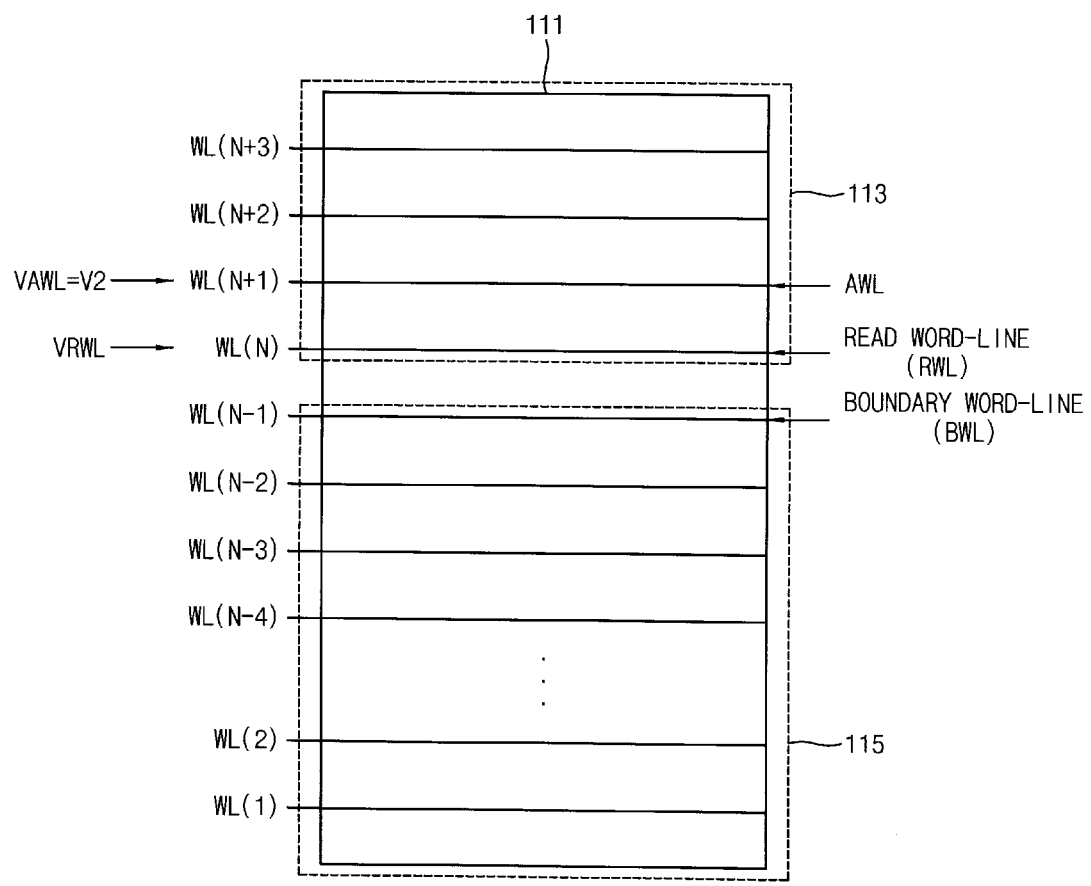
FIG. 15 is a diagram illustrating an example of a memory block included in the memory device of FIG. 2 in case difference information is equal to one.

FIG. 15 is a diagram illustrating an example of a memory block included in the memory device of FIG. 2 in case difference information is equal to one. Referring to FIG. 15, the memory block 111 may include a program region 115 and an erase region 113. The program region 115 may correspond to word-line numbers that are equal to or less than a word-line number of the boundary word-line BWL. For example, the word-line number of the boundary word-line BWL may be N-1. A region corresponding to word-line numbers that are equal to or less than N-1 may be included in the program region 115. The erase region 113 may correspond to word-line numbers that are greater than the word-line number of the boundary word-line BWL. For example, the word-line number of the boundary word-line BWL may be N-1. A region corresponding to word-line numbers that are greater than N-1 may be included in the erase region 113.

For example, the word-line number of the read word-line RWL may be N and the word-line number of the boundary word-line BWL may be N-1. The difference information DI may be the difference value between the word-line number of the read word-line RWL and the word-line number of the boundary word-line BWL. In this case, the difference information DI may be one. When the difference information DI is one, a word-line corresponding to the word-line number N+1 may be included in the erase region 113. Also, when the difference information DI is one, a word-line corresponding to the word-line number N-1 may be included in the program region 115. The value of the equivalent resistor corresponding to the memory cell included in the erase region 113 may be less than the value of the equivalent resistor corresponding to the memory cell included in the program region 115. Therefore, when the adjacent word-line AWL is included in the erase region 113, the adjacent word-line voltage VAWL may be the second voltage V2 that is lower than the first voltage V1. The error rate may be decreased in the read operation.

In an example embodiment, when the difference information DI is equal to one, a word-line number of the adjacent word-line AWL may be greater than a word-line number of the read word-line RWL by one. The difference information DI may be a difference value between the word-line number of the read word-line RWL and the word-line number of the boundary word-line BWL. For example, when the word-line number of the read word-line RWL is N and the word-line number of the boundary word-line BWL is N-1, the difference information DI may be one. In this case, the word-line number of the adjacent word-line AWL may be N+1.

In an example embodiment, the adjacent word-line voltage VAWL may be the second voltage V2. For example, when the word-line number of the adjacent word-line AWL is N+1, the voltage applied to a word-line corresponding to the word-line number N+1 may be the second voltage V2. The voltage applied to a word-line corresponding to the word-line number N-1 may be the first voltage V1. The first voltage V1 may be greater than the second voltage V2.

In an example embodiment, the adjacent word-line voltage VAWL may be greater than a voltage that is applied to an upper word-line. In an example embodiment, the adjacent word-line voltage VAWL may be equal to a voltage that is applied to an upper word-line. In an example embodiment, the upper word-line may be included in the erase region 113 where data is not programmed.

Figure 16:
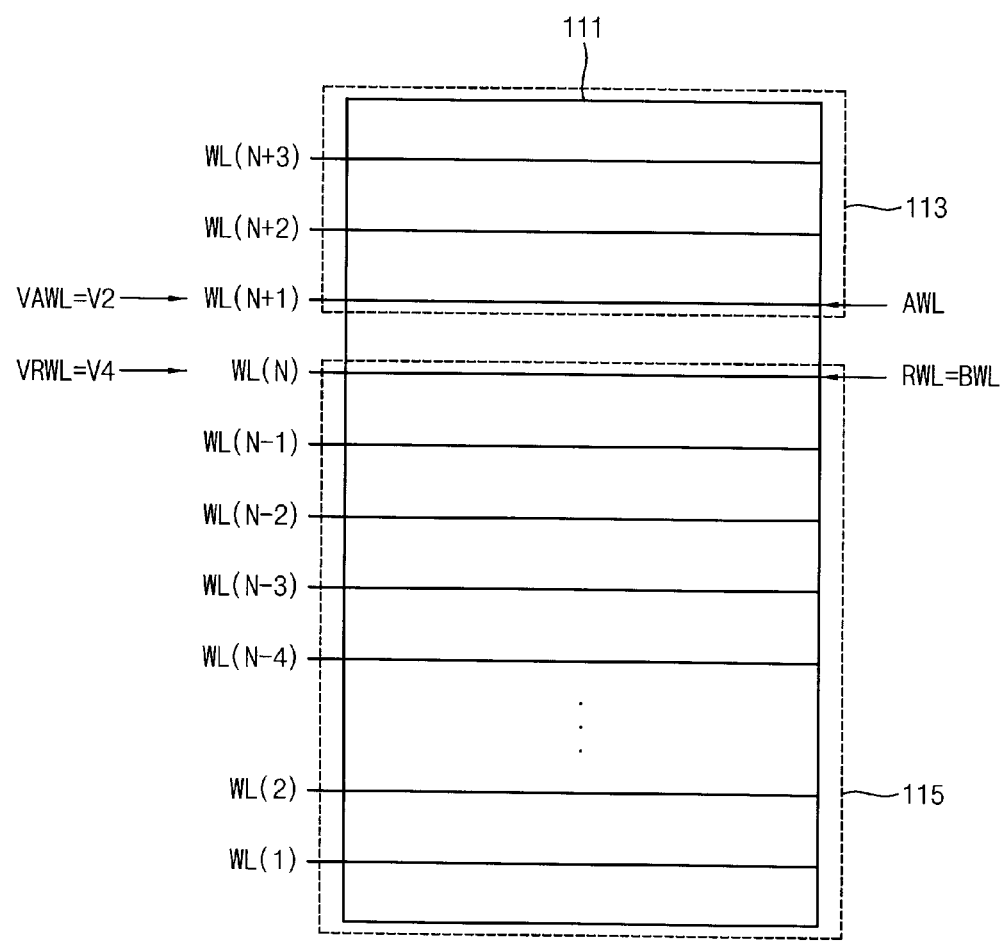
FIG. 16 is a diagram illustrating an example of a memory block included in the memory device of FIG. 2 in case difference information is equal to zero.

FIG. 16 is a diagram illustrating an example of a memory block included in the memory device of FIG. 2 when the difference information is equal to zero. Referring to FIG. 16, the memory block 111 may include a program region 115 and an erase region 113. For example, the word-line number of the boundary word-line BWL may be N. The region corresponding to word-line numbers that are equal to or less than N may be included in the program region 115. The region corresponding to word-line numbers that are greater than N may be included in the erase region 113.

As will be described in FIG. 21, a threshold voltage distribution of the memory cell corresponding to a programmed word-line may be changed as the word-line number of boundary word-line BWL is increased in program operation of the memory device 100. For example, in the program operation of the memory device 100, as the word-line number of boundary word-line BWL is increased, the threshold voltage distribution of the memory cell corresponding to the programmed word-line may be changed from a first state P1 to a first prime state P1'. In this case, when the data is read from the memory cell corresponding to the programmed word-line, the read word-line voltage VRWL may be changed.

In an example embodiment, when the read word-line RWL is included in the program region 115, the read word-line voltage VRWL may be a third voltage V3. When the difference information DI is zero, the read word-line voltage VRWL may be a fourth voltage V4 that is less than the third voltage V3. For example, the word-line number of the read word-line RWL may be N and the word-line number of the boundary word-line BWL may be N. The difference information DI may be the difference value between the word-line number of the read word-line RWL and the word-line number of the boundary word-line BWL. In this case, the difference information DI may be zero.

For example, when the word-line number of the boundary word-line BWL is N, the threshold voltage distribution of the memory cell corresponding to the word-line number N may be the first state P1. The read word-line voltage VRWL to read the data from the memory cell corresponding to the first state P1 may be lower than the read word-line voltage VRWL to read the data from the memory cell corresponding to the first prime state P1'. Therefore, when the difference information DI is zero, the read word-line voltage VRWL may be a fourth voltage V4 that is less than the third voltage V3.

The read method of the memory device 100 may be capable of decreasing the error rate by controlling the voltage applied to the read word-line RWL according to the difference information DI determined based on the read word-line RWL and the boundary word-line BWL.

In an example embodiment, a word-line number of the adjacent word-line AWL may be greater than a word-line number of the read word-line RWL by one. The adjacent word-line voltage VAWL may be the second voltage V2. For example, when the word-line number of the read word-line RWL is N and the word-line number of the adjacent word-line AWL that is adjacent to the read word-line RWL is N+1, the word-line number of the adjacent word-line AWL may be greater than the word-line number of the read word-line RWL by one. For example, the word-line number of the read word-line RWL may be N and the word-line number of the adjacent word-line AWL may be N+1. In this case, the word-lines corresponding to the word-line number of the adjacent word-line AWL may be included in the erase region 113 and the adjacent word-line voltage VAWL applied to the adjacent word-line AWL may be the second voltage V2.

Figure 17:
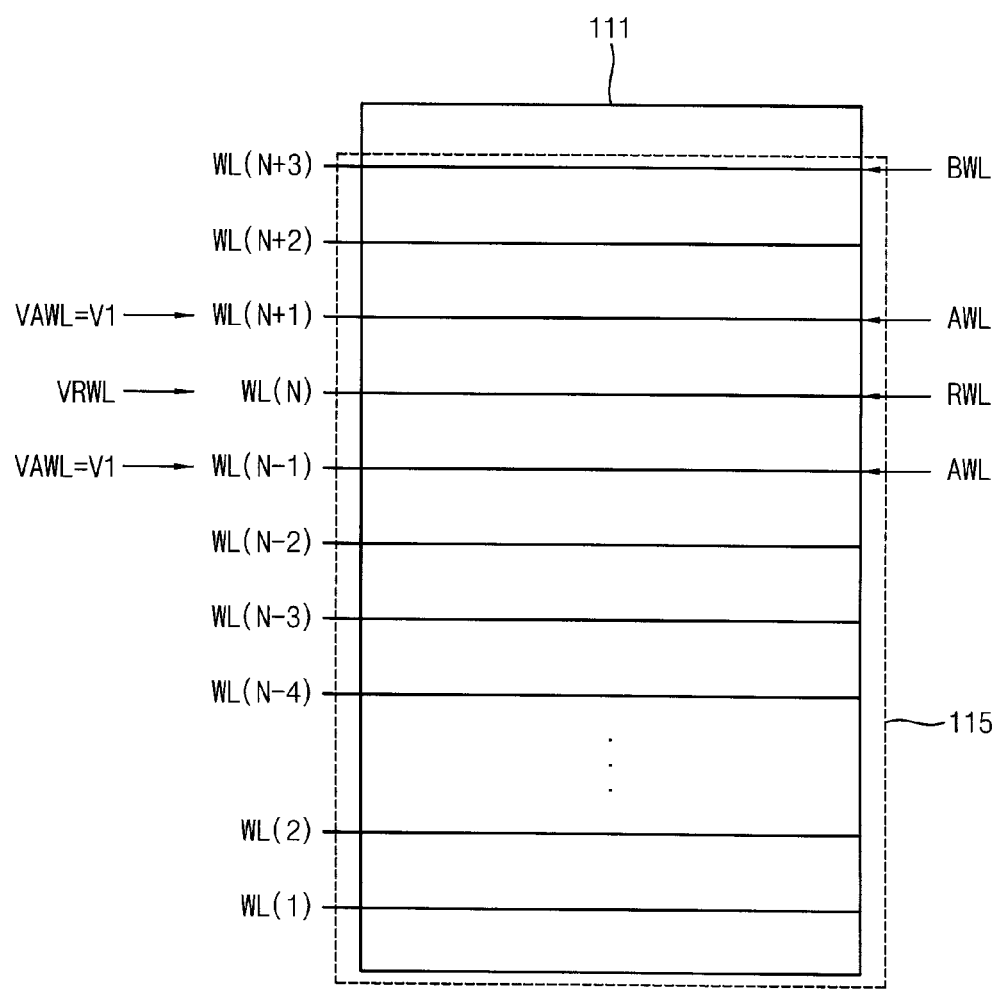
FIG. 17 is a diagram illustrating an example of a memory block included in the memory device of FIG. 2 in case a boundary word-line is uppermost word-line.

FIG. 17 is a diagram illustrating an example of a memory block included in the memory device of FIG. 2 when a boundary word-line is uppermost word-line. Referring to FIG. 17, when the boundary word-line BWL is an uppermost word-line included in the memory block 111, the adjacent word-line voltage VAWL may be the first voltage V1. For example, the word-line number of the boundary word-line BWL may be N+3. The word-line number N+3 may be the uppermost word-line of the memory block 111. The boundary word-line BWL may be the uppermost word-line. In this case, if the word-line number of the read word-line RWL is N, the voltage applied to the word-line corresponding to the word-line number N+1 and N−1 may be the first voltage V1.

The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

Figure 18:
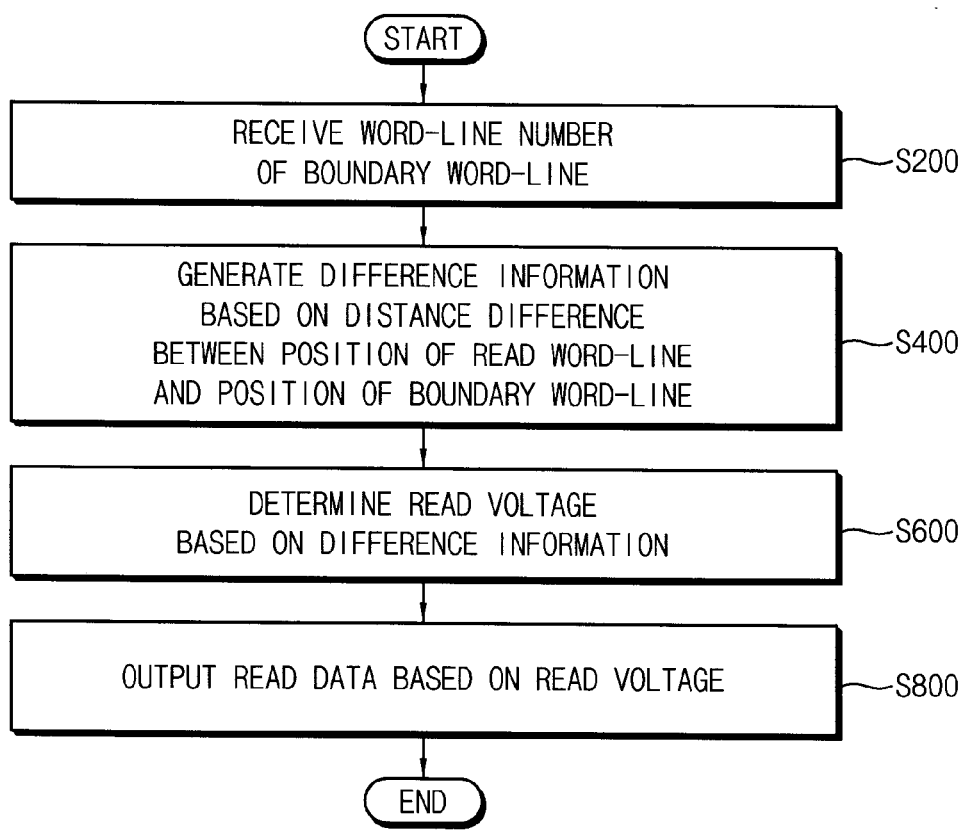
FIG. 18 is a flow chart illustrating a read method of a memory device according to example embodiments.
Figure 19:
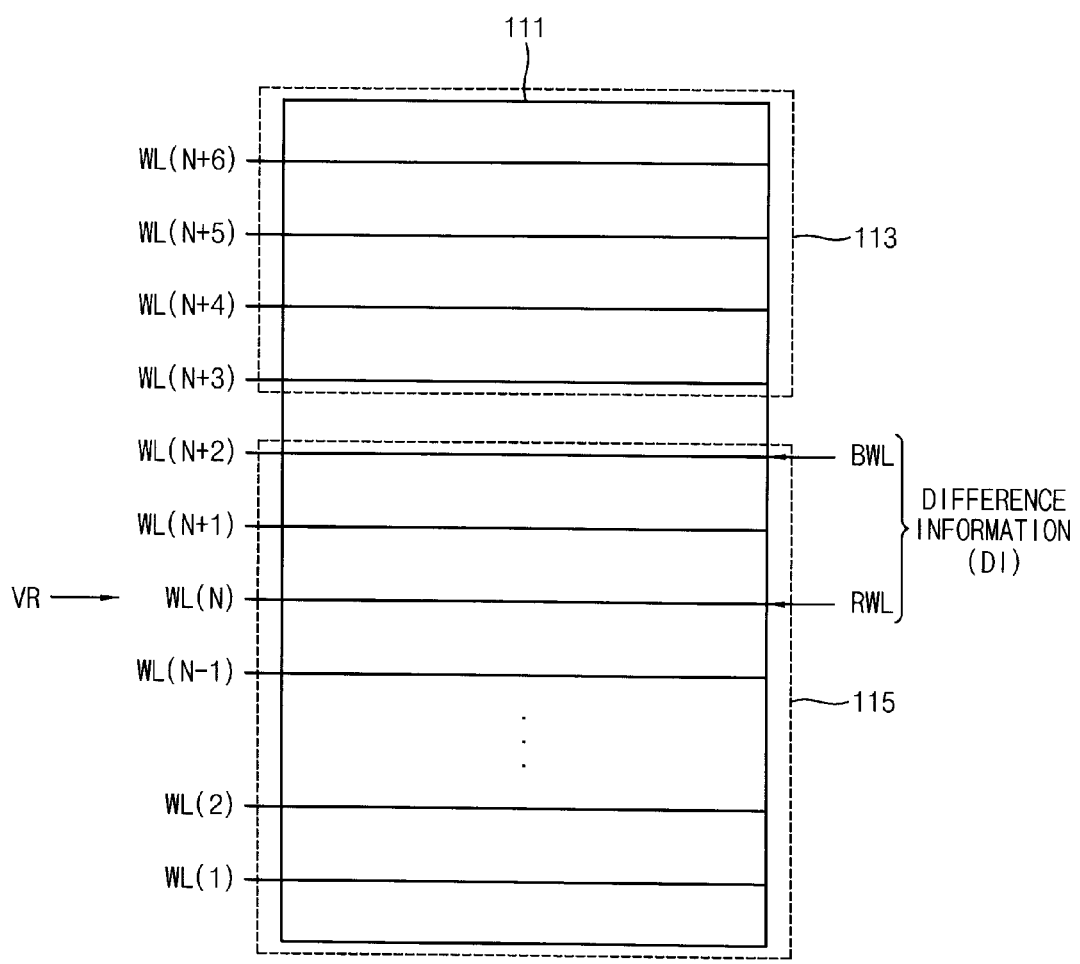
FIGS. 19 and 20 are diagrams illustrating an example of a memory block included in the memory device according to example embodiments.
Figure 20:
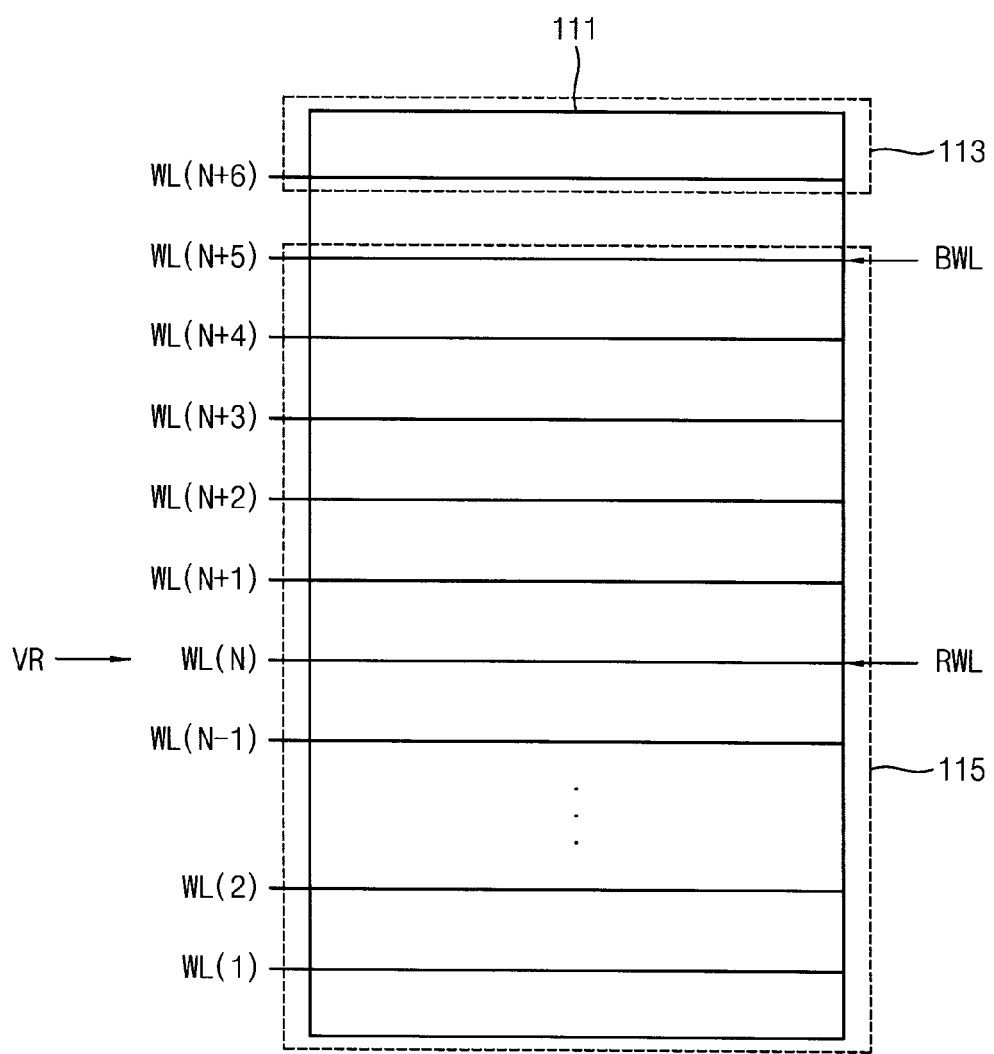

FIG. 18 is a flow chart illustrating a read method of a memory device according to example embodiments and FIGS. 19 and 20 are diagrams illustrating an example of a memory block 111 included in the memory device according to example embodiments. Referring to FIGS. 18 to 20, in a read method of a memory device 100, the memory device 100 may receive a word-line number of a boundary word-line BWL corresponding to a last programmed word-line in a memory block 111 included in a memory cell array 110 (S200). The difference information DI is generated based on a distance difference between a position of a read word-line RWL and a position of a boundary word-line BWL (S400). The read word-line RWL corresponds to a read address. The boundary word-line BWL corresponds to a last programmed word-line in a memory block 111 included in a memory cell array 110.

For example, the distance difference between a position of a read word-line RWL and a position of a boundary word-line BWL may be a difference value between a word-line number of the read word-line RWL and a word-line number of the boundary word-line BWL. The distance difference may be a physical distance or a logical distance determined by the word-line number.

For example, the word-line number of the boundary word-line BWL corresponding to the last programmed word-line in a memory block 111 may be N+2. When the word-line number of the boundary word-line BWL is N+2 and the word-line number of the read word-line RWL is N, the difference information DI corresponding to difference value between the word-line number of the read word-line RWL and the word-line number of the boundary word-line BWL may be 2. Also, when the word-line number of the boundary word-line BWL is N+5 and the word-line number of the read word-line RWL is N, the difference information DI corresponding to a difference value between the word-line number of the read word-line RWL and the word-line number of the boundary word-line BWL may be 5. In an example embodiment, the distance difference may be the difference value between the word-line number of the read word-line RWL and the word-line number of the boundary word-line BWL.

The memory block 111 may include a program region 115 and an erase region 113. The program region 115 may correspond to word-line numbers that are equal to or less than a word-line number of the boundary word-line BWL. For example, the word-line number of the boundary word-line BWL may be N+2. A region corresponding to word-line numbers that are equal to or less than N+2 may be included in the program region 115.

The erase region 113 may correspond to word-line numbers that are greater than the word-line number of the boundary word-line BWL. For example, the word-line number of the boundary word-line BWL may be N+2. A region corresponding to word-line numbers that are greater than N+2 may be included in the erase region 113.

A read voltage VR applied to the read word-line RWL is determined based on the difference information DI (S600). For example, the word-line number of the read word-line RWL may be N. The read word-line voltage VRWL applied to the read word-line RWL, when the difference information DI is two, may be lower than the read word-line voltage VRWL applied to the read word-line RWL when the difference information DI is five. A read data corresponding to the read address is outputted based on the read voltage VR (S800). The read voltage VR may be the read word-line voltage VRWL.

The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

Figure 21:
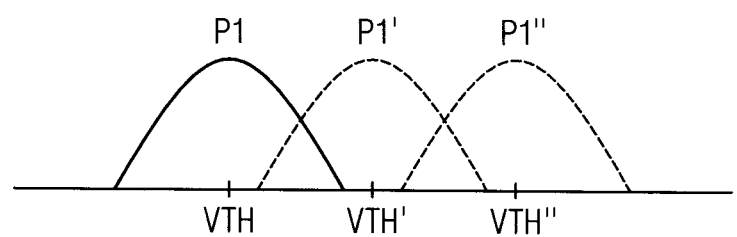
FIG. 21 is a diagram for describing a read method of a memory device of FIG. 18.
Figure 22:
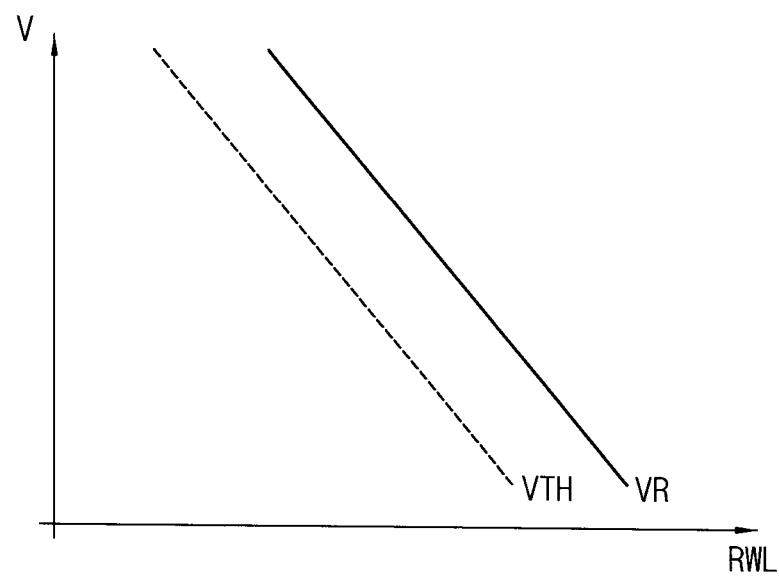
FIG. 22 is a diagram illustrating a read voltage and a threshold voltage according to a read word-line.
Figure 23:
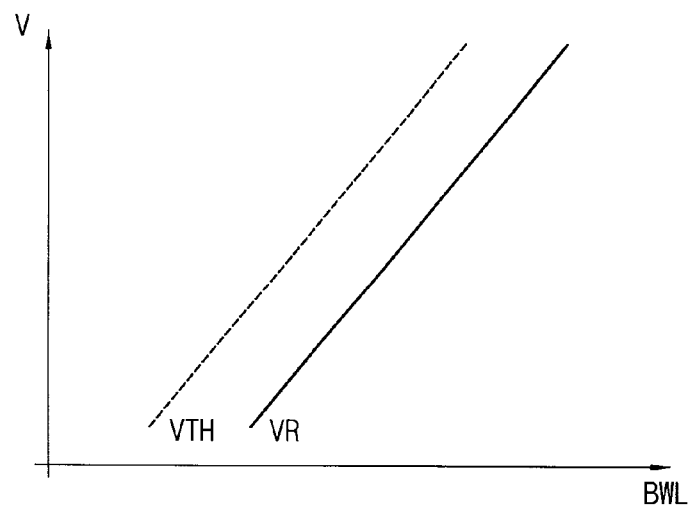
FIG. 23 is a diagram illustrating a read voltage and a threshold voltage according to a boundary word-line.

FIG. 21 is a diagram for describing a read method of a memory device of FIG. 18, FIG. 22 is a diagram illustrating a read voltage and a threshold voltage according to a read word-line and FIG. 23 is a diagram illustrating a read voltage and a threshold voltage according to a boundary word-line BWL. Referring to FIG. 21, a threshold voltage distribution of the memory cell corresponding to a programmed word-line may be changed as the word-line number of boundary word-line BWL is increased in program operation of the memory device 100. For example, in the program operation of the memory device 100, as the word-line number of boundary word-line BWL is increased, the threshold voltage distribution of the memory cell corresponding to the programmed word-line may be changed from a first state P1 to a first prime state P1'. In this case, when the data is read from the memory cell corresponding to the programmed word-line, the read word-line voltage VRWL may be changed.

Referring to FIGS. 20 and 22, when the word-line number of boundary word-line BWL is fixed, the read voltage VR may be changed based on the word-line number of the read word-line RWL. For example, the word-line number of the boundary word-line BWL may be N+5. When the word-line number of the boundary word-line BWL is N+5, the read voltage VR may be decreased as the word-line number of the read word-line RWL is increased. Also, when the word-line number of the boundary word-line BWL is N+5, the read voltage VR may be increased as the word-line number of the read word-line RWL is decreased.

Referring to FIGS. 19, 20 and 23, when the word-line number of the read word-line RWL is fixed, the read voltage VR may be changed based on the word-line number of the boundary word-line BWL. For example, the word-line number of the read word-line RWL may be N. When the word-line number of the read word-line RWL is N, the read voltage VR may be increased as the word-line number of the boundary word-line BWL is increased. Also, when the word-line number of the read word-line RWL is N, the read voltage VR may be decreased as the word-line number of the boundary word-line BWL is decreased. In an example embodiment, the read voltage VR may be determined based on the word-line number of the boundary word-line BWL.

The read method of the memory device 100 according to example embodiments may be capable of increasing the performance by controlling the voltages applied to the adjacent word-line AWL and the read word-line RWL according to the difference information DI determined based on the read word-line RWL and the boundary word-line BWL.

Figure 24:
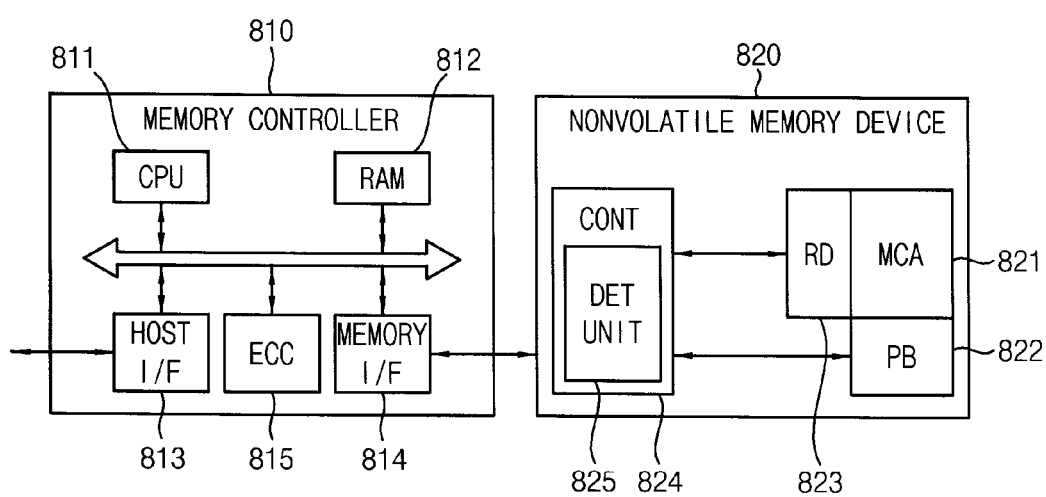
FIG. 24 is a block diagram illustrating a memory system according to example embodiments.

FIG. 24 is a block diagram illustrating a memory system according to example embodiments. Referring to FIG. 24, a memory system 800 comprises a memory controller 810 and a nonvolatile memory device 820.

Nonvolatile memory device 820 comprises a memory cell array 821, a page buffer unit 822, a row decoder 823, and a control circuit 824. Memory cell array 821 comprises multiple memory cells, page buffer unit 822 may be operated as a write driver or a sensing amplifier according to an operation mode, and row decoder 823 may select a word line in response to a row address. Control circuit 824 controls page buffer unit 822 and row decoder 823, and may comprise a determination unit 825 which performs the second verify operation for whether a program/erase error symptom exists in the target memory cells of the memory cells.

Nonvolatile memory device 820 may further perform the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 820 may effectively prevent an error from being generated which is uncorrectable due to the generation of a progressive problem in the target memory cells determined as the state of a program/erase pass and the performance of nonvolatile memory device 820 may be improved.

Memory controller 810 controls nonvolatile memory device 820. Memory controller 810 controls a data exchange between an external host (not shown) and nonvolatile memory device 820. Memory controller 810 may include a CPU (Central Processing Unit) 811, a buffer memory 812, a host interface 813, and a memory interface 814. CPU 811 may perform an operation for the data exchange. Buffer memory 812 comprises a dynamic random access memory (DRAM), static random access memory (SRAM), PRAM, FRAM, RRAM, or MRAM. According to an embodiment of the inventive concept, buffer memory 812 may be placed at an inside or outside of controller 810.

Host interface 813 is connected to the host and memory interface 814 is connected to nonvolatile memory device 820. CPU 811 communicates with the host through host interface 813. For example, the host interface 813 may be configured to communicate with the host through at least one among various interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), or Integrated Drive Electronics (IDE). Further, CPU 811 may communicate with memory device 820 through memory interface 814. According to an embodiment of the inventive concept, the memory controller 810 may further comprise an error correction block 815 for correcting an error. According to some embodiments of the inventive concept, the memory controller 810 comprises a built-in memory device 820 or memory controller 810 and nonvolatile memory device 820 may be implemented as mutually separated chips.

Memory system 800 may be implemented in such a form as a memory card or a solid state drive. Nonvolatile memory device 820, memory controller 810 and/or memory system 800 may be implemented in various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 25:
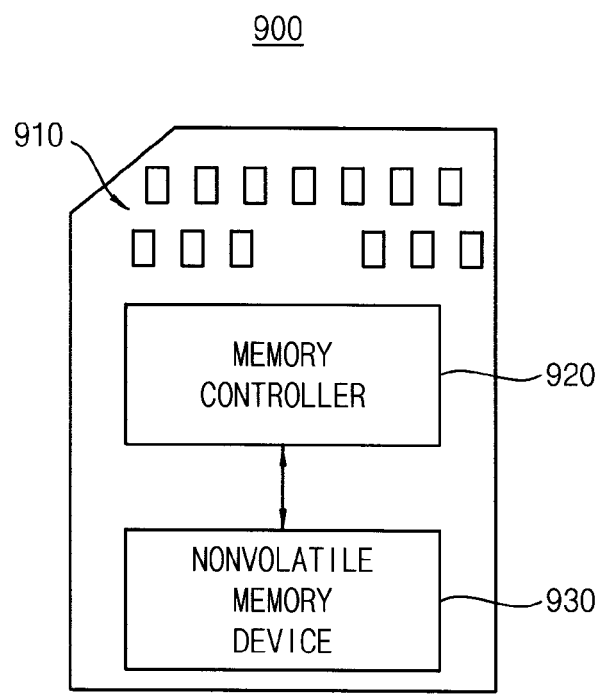
FIG. 25 is a diagram illustrating an application example of a memory system to a memory card according to example embodiments.

FIG. 25 is a diagram illustrating an application example of a memory system to a memory card according to example embodiments. Referring to FIG. 25, a memory card 900 comprises multiple connecting pins 910, a memory controller 920 and a nonvolatile memory device 930. Connecting pins 910 are connected to a host (not shown) such that signals are transceived between the host and memory card 900. Connecting pins 910 may comprise a clock pin, a command pin, data pin and/or a reset pin, for example.

The memory controller 920 receives data from the host and stores the received data in nonvolatile memory device 930. Nonvolatile memory device 930 further performs the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 930 may effectively prevent from being generated an error which is uncorrectable due to the generation of a progressive problem in the target memory cells determined as the program/erase pass state and the performance of nonvolatile memory device 930 may be improved.

Memory card 900 may be, for instance, a memory card such as a an Multi-Media Card (MMC), an embedded Multi-Media Card (eMMC), a hybrid eMMC, a Secure Digital (SD) card, a micro-SD card, a memory stick, an ID card, a Personal Computer Memory Card International Association (PCMCIA) card, a chip card, an USB card, a smart card, or a Compact Flash (CF) Card.

According to some embodiments of the inventive concept, memory card 900 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 26:
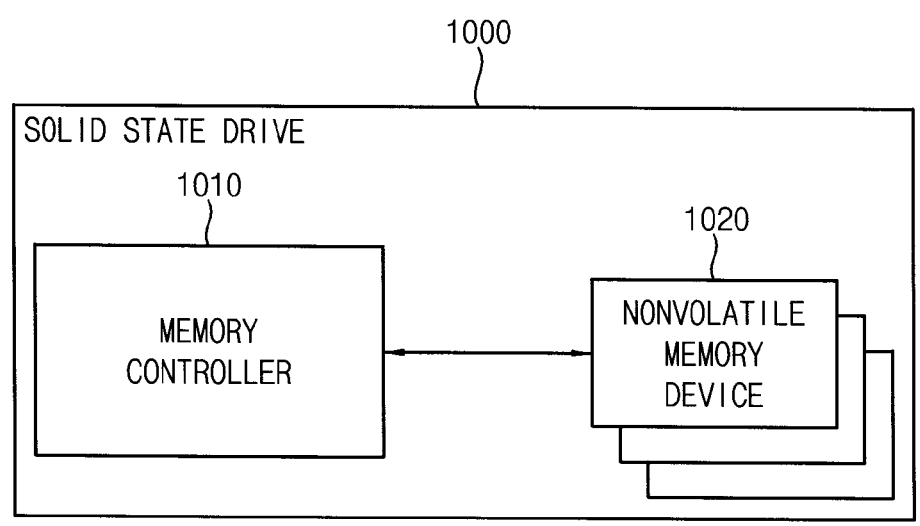
FIG. 26 is a diagram illustrating an application example of a memory system to a solid state drive according to example embodiments.

FIG. 26 is a diagram illustrating an application example of a memory system to a solid state drive according to example embodiments. Referring to FIG. 26, SSD 1000 comprises a memory controller 1010 and multiple nonvolatile memory devices 1020. Memory controller 1010 receives data from the host (not shown) and stores the received data in nonvolatile memory device 1020

In a conventional method of programming a memory device, if the program/erase cycle is greater than a predetermined number regardless of the error check result, the memory device is programmed with a slow program speed SPS by increasing the program time. In this case, even though the memory device is programmed with a fast program speed FPS in case of a low bit error rate, because the program/erase cycle is greater than the predetermined number, the memory device may be programmed with the slow program speed SPS. Therefore even though the memory device is programmed with the fast program speed FPS, the memory device may be programmed with the slow program speed SPS and the memory device may not be used efficiently. The method of programming the memory device according to example embodiments may provide the error-check result based on the code-word that is read from the plurality of memory cells and the program time of programming the plurality of memory cells may be controlled based on the error-check result. Therefore the memory device may be efficiently used and the program time of the memory device may be decreased.

According to an embodiment of the inventive concept, SSD 1000 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 27:
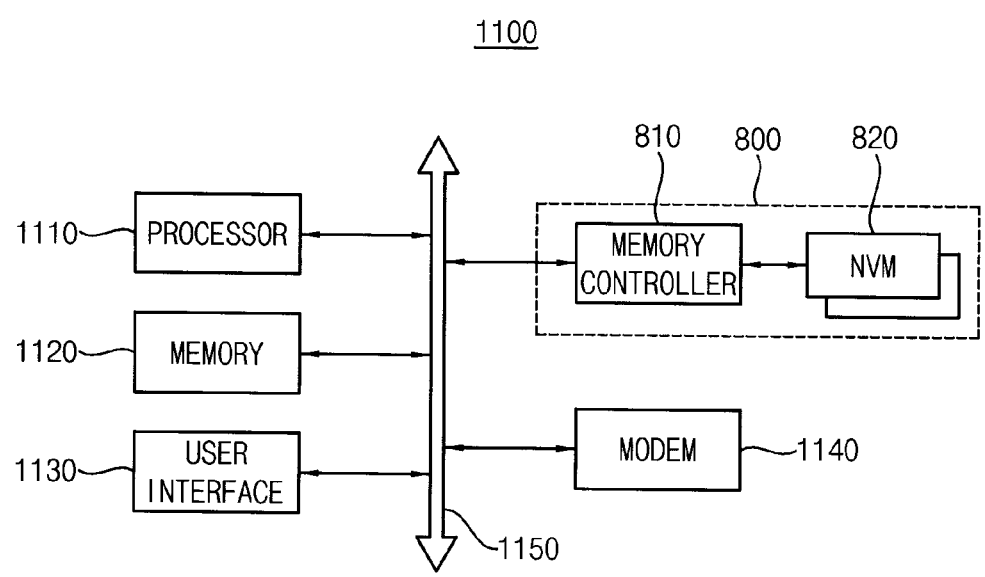
FIG. 27 is a block diagram illustrating a computing system according to example embodiments.

FIG. 27 is a block diagram illustrating a computing system according to example embodiments. Referring to FIG. 27, computing system 1100 comprises a processor 1110, a memory device 1120, a user interface 1130, and a memory system 8000. In some embodiments, computing system 1100 further comprises a modem 1140 such as a baseband chipset.

Processor 1110 executes a specific calculation or tasks. For example, processor 1110 may be a processor or a CPU. Processor 1110 may be connected to memory device 1120 through a bus 1150 such as an address bus, a control bus or a data bus. For example, memory device 1120 may be implemented with DRAM, mobile DRAM, SRAM, PRAM, FRAM, RRAM or MRAM. Further, processor 1110 may be connected to an expansion bus such as a PCI. Thus, processor 1110 may control user interface 1130 including at least one input device such as a keyboard or a mouse, and at least one output device such as a printer or a display. Modem 1140 may wirelessly transceive data with an external apparatus. Memory device 820 may store the data processed by processor 1110 or the data received through modem 1140 through memory controller 810 therein. Computing system 1100 may further comprise a power supply for supplying an operation voltage. Further, according to an embodiment of the inventive concept, computing system 1100 may further include an application chipset, and a camera image processor (CIS).

Embodiments may be applied to, e.g., a nonvolatile memory device such as a flash memory, and various apparatuses and systems including the nonvolatile memory device. As examples, embodiments may be expansively applied to a memory card, a solid state drive, a computer, a laptop computer, a cellular phone, a smart phone, an MP3 player, a PDA, a PMP, a digital TV, a digital camera, and a portable game console.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of reading a memory device, the method comprising:

generating a difference information based on a distance difference between a position of a read word-line and a position of a boundary word-line, the read word-line corresponding to a read address, the boundary word-line corresponding to a last programmed word-line in a memory block included in a memory cell array;

determining a read word-line voltage and an adjacent word-line voltage based on the difference information, the read word-line voltage being applied to the read word-line, the adjacent word-line voltage being applied to an adjacent word-line that is adjacent to the read word-line; and outputting a read data corresponding to the read address based on the read word-line voltage and the adjacent word-line voltage;

wherein the memory block includes a program region corresponding to word-line numbers that are equal to or less than a word-line number of the boundary word-line, and an erase region corresponding to word-line numbers that are greater than the word-line number of the boundary word-line;

wherein, when the adjacent word-line is included in the program region, the adjacent word-line voltage is a first voltage; and wherein, when the adjacent word-line is included in the erase region, the adjacent word-line voltage is a second voltage that is lower than the first voltage.

2. The method of claim 1, wherein, when the difference information is greater than one, the adjacent word-line voltage is the second voltage, the difference information being a difference value between a word-line number of the read word-line and the word-line number of the boundary word-line.

3. The method of claim 2, wherein a word-line number of the adjacent word-line is greater than the word-line number of the read word-line by one.

4. The method of claim 3, wherein the adjacent word-line voltage is greater than a voltage that is applied to an upper word-line, a word-line number of the upper word-line being greater than the word-line number of the adjacent word-line.

5. The method of claim 3, wherein the adjacent word-line voltage is equal to a voltage that is applied to an upper word-line, a word-line number of the upper word-line being greater than the word-line number of the adjacent word-line.

6. The method of claim 2, wherein a word-line number of the adjacent word-line is less than the word-line number of the read word-line by one.

7. The method of claim 6, wherein the adjacent word-line voltage is greater than a voltage that is applied to a lower word-line, a word-line number of the lower word-line being less than the word-line number of the adjacent word-line and greater than the word-line number of the boundary word-line.

8. The method of claim 6, wherein the adjacent word-line voltage is equal to a voltage that is applied to a lower word-line, a word-line number of the lower word-line being less than the word-line number of the adjacent word-line and greater than the word-line number of the boundary word-line.

9. The method of claim 1, wherein, when the difference information is equal to one, a word-line number of the adjacent word-line is greater than a word-line number of the read word-line by one, the difference information being a difference value between the word-line number of the read word-line and the word-line number of the boundary word-line.

10. The method of claim 9, wherein the adjacent word-line voltage is the second voltage.

11. The method of claim 1, wherein, when the read word-line is included in the program region, the read word-line voltage is a third voltage; and wherein, when the difference information is zero, the read word-line voltage is a fourth voltage that is less than the third voltage.

12. The method of claim 11, wherein a word-line number of the adjacent word-line is greater than a word-line number of the read word-line by one; and wherein the adjacent word-line voltage is the second voltage.

13. A memory device comprising:

a memory cell array including memory cells that are in a cross region of word-lines and bit-lines and defining memory blocks;

a voltage generator configured to generate a read word-line voltage and an adjacent word-line voltage, the read word-line voltage being applied to a read word-line corresponding to a read address, the adjacent word-line voltage being applied to an adjacent word-line that is adjacent to the read word-line; and a control circuit configured to control the voltage generator to generate the read word-line voltage and the adjacent word-line voltage based on a difference information that is generated based on a distance difference between a position of a read word-line and a position of a boundary word-line, the read word-line corresponding to a read address, the boundary word-line corresponding to a last programmed word-line in a memory block included in a memory cell array, wherein the memory block includes a program region corresponding to word-line numbers that are equal to or less than a word-line number of the boundary word-line, and an erase region corresponding to word-line numbers that are greater than the word-line number of the boundary word-line;

wherein, when the adjacent word-line is included in the program region, the adjacent word-line voltage is a first voltage; and wherein, when the adjacent word-line is included in the erase region, the adjacent word-line voltage is a second voltage that is lower than the first voltage.

14. The memory device of claim 13, wherein the read word-line is included in the program region; and wherein the difference information is a difference value between a word-line number of the boundary word-line and a word-line number of the read word-line.

15. The memory device of claim 13, wherein the read word-line voltage is determined based on a word-line number of the boundary word-line, and wherein the memory cell array includes a three-dimensional array.

16. The memory device of claim 13, wherein, when the difference information is greater than one, the adjacent word-line voltage is the second voltage, the difference information being a difference value between a word-line number of the read word-line and the word-line number of the boundary word-line.

17. The memory device of claim 13, wherein, when the difference information is equal to one, a word-line number of the adjacent word-line is greater than a word-line number of the read word-line by one, the difference information being a difference value between the word-line number of the read word-line and the word-line number of the boundary word-line.

18. The memory device of claim 13, wherein, when the read word-line is included in the program region, the read word-line voltage is a third voltage; and wherein, when the difference information is zero, the read word-line voltage is a fourth voltage that is less than the third voltage.

* * * * *